(12) United States Patent
Ishii et al.

(10) Patent No.: US 7,342,449 B2
(45) Date of Patent: Mar. 11, 2008

(54) DIFFERENTIAL AMPLIFIER, AND DATA DRIVER OF DISPLAY DEVICE USING THE SAME

(75) Inventors: Jun-ichirou Ishii, Tokyo (JP); Hiroshi Tsuchi, Tokyo (JP)

(73) Assignee: NEC Corporation, Toyko (JP)

( * ) Notice: Subject to any disclaimer, the term of this patent is extended or adjusted under 35 U.S.C. 154(b) by 213 days.

(21) Appl. No.: 11/197,635

(22) Filed: Aug. 4, 2005

(65) Prior Publication Data

US 2006/0028274 A1 Feb. 9, 2006

(30) Foreign Application Priority Data

Aug. 5, 2004 (JP) ............... 2004-229092

(51) Int. Cl.
*H03F 3/45* (2006.01)
(52) U.S. Cl. ............... 330/253; 330/255; 330/260
(58) Field of Classification Search ............... 330/253, 330/255, 260
See application file for complete search history.

(56) References Cited

U.S. PATENT DOCUMENTS

| | | | | |
|---|---|---|---|---|
| 5,281,924 A | * | 1/1994 | Maloberti et al. | ......... 330/253 |
| 5,311,145 A | | 5/1994 | Huijsing et al. | |
| 5,909,146 A | * | 6/1999 | Okada | ......... 330/255 |
| 5,939,931 A | * | 8/1999 | Noro | ......... 327/424 |
| 6,052,025 A | * | 4/2000 | Chang et al. | ......... 330/253 |
| 6,246,351 B1 | | 6/2001 | Yilmaz | |
| 6,252,435 B1 | * | 6/2001 | Wu et al. | ......... 327/65 |
| 6,577,185 B1 | * | 6/2003 | Chandler et al. | ......... 330/9 |

FOREIGN PATENT DOCUMENTS

JP  A-6-326529  11/1994

* cited by examiner

*Primary Examiner*—Patricia Nguyen
(74) *Attorney, Agent, or Firm*—Scully, Scott, Murphy & Presser PC

(57) ABSTRACT

Disclosed is a Rail-to-Rail amplifier including a plurality of differential pairs of a first conductivity type and a plurality of differential amplifiers of a second conductivity type each with one of an input pair thereof constituting an input terminal, a differential amplifier that outputs an output voltage according to the range of provided supply voltage, a determination unit for determining whether to stop operations of the differential pairs of the first conductivity type or the second conductivity type according to a predetermined input signal, and a differential pair control unit for stopping the operations of the differential pairs of the first conductivity type or the second conductivity type according to the output signal of the determination unit.

20 Claims, 25 Drawing Sheets

| $V_{out}$ | $V_{resN}$ | $V_{resP}$ |
|---|---|---|
| $V_{ss} \sim V_{SN}$ | L | L |
| $V_{SN} \sim V_{SP}$ | H | L |
| $V_{SP} \sim V_{dd}$ | H | H |

FIG. 17

| OUTPUT VOLTAGE $V_{out}$ | $V_{ss} \sim V_{SN}$ | $V_{SN} \sim V_{SP}$ | $V_{SP} \sim V_{dd}$ |
|---|---|---|---|
| P-CH DIFFERENTIAL PAIRS | ON | ON | OFF |
| N-CH DIFFERENTIAL PAIRS | OFF | ON | ON |

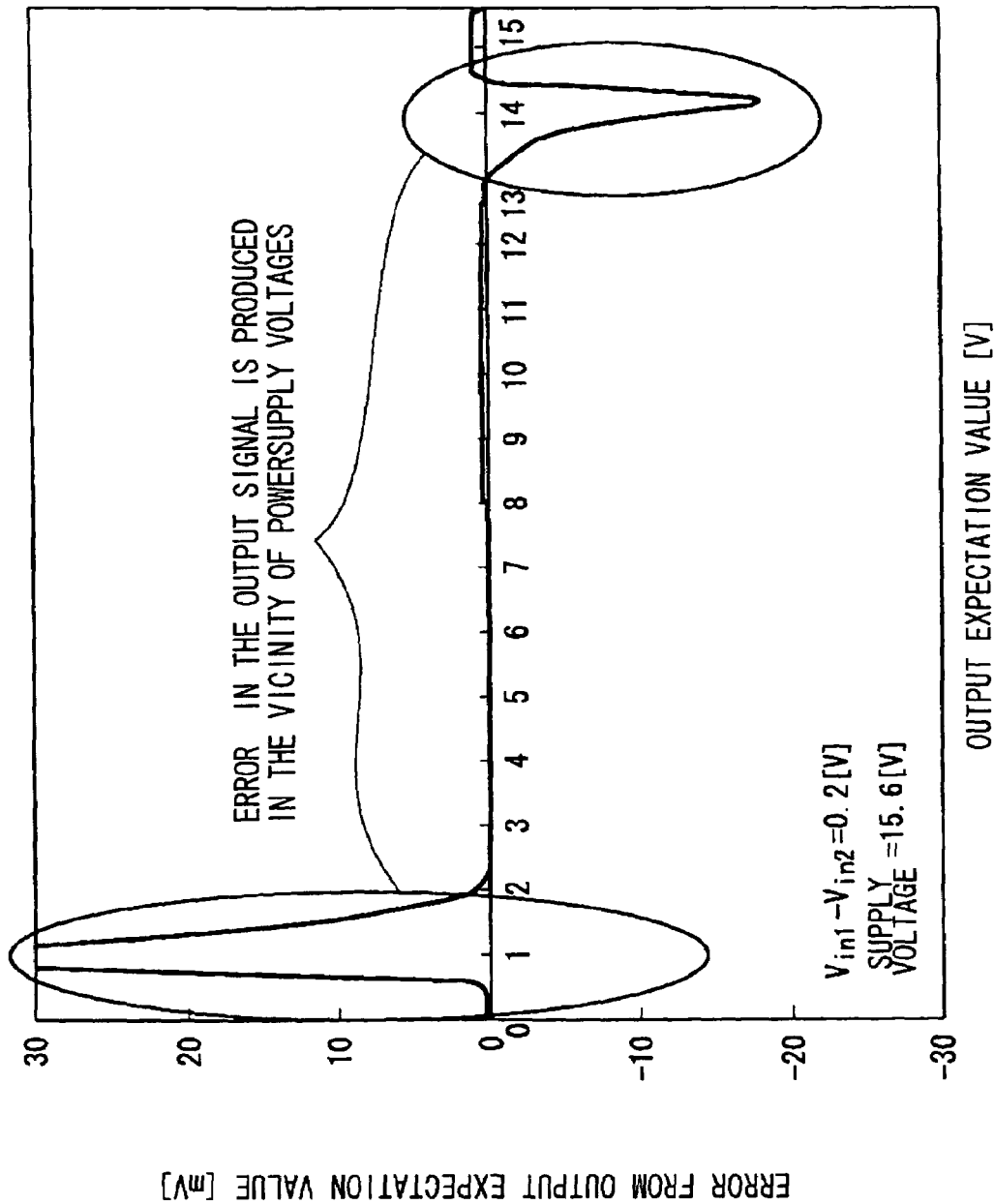

DIFFERENTIAL AMPLIFIER, AND DATA DRIVER OF DISPLAY DEVICE USING THE SAME

FIELD OF THE INVENTION

The present invention relates to a differential amplifier. More specifically, the invention relates to the differential amplifier suitable for being applied to the data driver of a liquid crystal display device or the like and a display device that uses it.

BACKGROUND OF THE INVENTION

In recent years, liquid crystal display devices (LCDs) featuring thinness, lightweight, and low power consumption have become widespread, and have often been used as display units of mobile devices such as cellular phones (mobile phones), PDAs (personal digital assistants), and notebook PCs. Recently, however, a technology for supporting a larger screen and moving images of the liquid crystal display device has been developed, so that implementation of large-screen display devices and large-screen liquid crystal television sets of a stationary type as well as those for mobile applications has become possible. As these liquid crystal display devices, the liquid crystal display devices with an active matrix driving system that enables high-resolution display are used. First, a typical configuration of the liquid crystal display device with the active matrix driving system will be outlined with reference to FIG. 20. A main configuration connected to one picture element in a liquid crystal display unit is schematically shown in the form of an equivalent circuit.

Generally, a display unit 960 in the liquid crystal device with the active matrix driving system is constituted from a substrate, an opposed substrate, and a structure with liquid crystals sealed therein between these opposed two substrates. In the semiconductor substrate, transparent pixel electrodes 964 and thin film transistors (TFTs) 963 (in the case of a color SXGA panel, for example, 1280×3 pixel rows×1024 pixel columns) are arranged in a matrix form. On the entire surface of the opposed substrate, one transparent electrode 966 is formed.

A TFT 963 having a switching function is controlled by a scan signal. When the TFT 963 is turned on, a gray scale voltage corresponding to a video signal is applied to a pixel electrode 964. The transmissivity of a liquid crystal changes due to a difference in potential between each of the pixel electrodes 964 and the opposed substrate electrode 966, and the difference in potential is held at a liquid crystal capacitance 965 for a certain period, thereby displaying an image.

On the semiconductor substrate, data lines 962 for sending a plurality of levels of voltage (gray scale voltages) applied to the respective pixel electrodes 964 and scan lines 961 each for sending the scan signal are arranged in a matrix form (in the case of the color SXGA panel, 1280×3 data lines and 1024 scan lines are arranged). The scan lines 961 and the data lines 962 become large capacitive loads due to capacitances generated at mutual intersections and liquid crystal capacitances sandwiched with the opposed substrate electrode.

The scan signal is supplied to a scan line 961 by a gate driver 970, and supply of the gray scale voltage to each of the pixel electrodes 964 is performed from a data driver 980 through a data line 962.

Rewriting of data for one screen is performed in one frame period (1/60 seconds), and each pixel row (each line) is selected one by one for each scan line. The gray scale voltage is supplied from each data line within the period of the selection.

While the gate driver 970 should supply at least a binary scan signal, the data driver 980 needs to drive the data line by multi-levels of gray scale voltages corresponding to the number of gray scales. For this reason, as the buffer unit of the data driver 980, a differential amplifier that can perform voltage output with high accuracy is employed.

Further, in recent years, higher picture quality (creation of multiple colors) has been pursued, so that the demand for at least 260 thousand colors (6-bit video data for each of RGB), and further the demand for 16,800 thousand colors (8-bit video data for each of RGB) or more have increased.

For this reason, the data driver that outputs gray scale voltages corresponding to multi-bit video data is required to perform voltage output with an extremely high degree of accuracy. Further, the number of devices in a circuit unit that processes the video data has increased, and the chip area of a data driver LSI has increased, which have become a factor causing higher cost. This problem will be described below in detail.

FIG. 21 is a diagram showing a configuration of the data driver 980 in FIG. 20, and shows the pertinent portion of the data driver 980 in the form of blocks. Referring to FIG. 21, the data driver 980 includes a latch address selector 981, a latch 982, a gray scale voltage generation circuit 983, a plurality of decoders 984, and a plurality of buffer circuits 985.

The latch address selector 981 determines a data latch timing based on a clock signal CLK. The latch 982 latches digital video data based on the timing determined by the latch address selector 981, and outputs the latched data to each of the decoders 984 in unison in response to an STB signal (strobe signal). The gray scale voltage generation circuit 983 generates gray scale voltages with the number of gray scales corresponding to the video data. Each decoder 984 selects one of the gray scale voltages corresponding to the input data, for output. Each buffer circuit 985 receives the gray scale voltage output from the decoder 984, current amplifies the gray scale voltage, for output as an output voltage Vout.

When 6-bit video data is input, for example, the number of gray scales is 64. The gray scale voltage generation circuit 983 generates gray scale voltages at 64 levels. Each decoder 984 includes a circuit for selecting one of the gray scale voltages at 64 levels.

On the other hand, when 8-bit video data is supplied, the number of gray scales becomes 256. Thus, the gray scale voltage generation circuit 983 generates gray scale voltages at 256 levels. Each decoder 984 includes a circuit for selecting one of the gray scale voltages at 256 levels.

When multiple bits are used as described above, the circuit sizes of the gray scale voltage generation circuit 983 and the decoders 984 will increase. When an increase from six bits to eight bits is made, the circuit sizes become four times or larger. Accordingly, the chip area of the data driver LSI increases to bring about the higher cost due to the use of multiple bits.

On contrast therewith, there is proposed in Patent Document 1 (U.S. Pat. No. 6,246,351) an example of a technique for suppressing an increase in the chip area of the data driver LSI even if multiple bits are used. FIG. 22 is a diagram showing a configuration described in the Patent Document 1. Referring to FIG. 22, there is shown a differential amplifier in which a plurality of differential pairs 3110, 3120, 3130, and 3140 of a same polarity are connected to a common current mirror 3101, and these differential pairs are driven by individual current sources.

One of voltages Vin1 and Vin2 is supplied to each of the gates (non-inverting inputs) of N-channel MOS transistors 3111, 3121, 3131, and 3141 of the differential pairs 3110, 3120, 3130, and 3140, respectively, through a switch 3150, and an output voltage Vout is feedback connected to the gates (inverting inputs) of the transistors 3112, 3122, 3132, and 3142. According to this differential amplifier, a voltage obtained by internally dividing the voltage Vin1 and the voltage Vin2 at an arbitrary ratio according to a ratio between the number of inputs of the Vin1 and the number of inputs of the Vin2, supplied to the non-inverting inputs.

By using the differential amplifier in FIG. 22 as the buffer circuit in FIG. 21, the number of input gray scale power supplies can be reduced more greatly than the number of gray scale power supplies to be output.

When the differential amplifier of the configuration shown in FIG. 22 has four differential pairs as shown in the drawing, for example, four voltages obtained by internally dividing the Vin1 and the Vin2 by ratios of one to three, one to one, and three to one, respectively and the Vin2 can be output (four divided outputs). In other words, the number of gray scale power supply lines for input can be reduced more than the number of gray scales for output. Accordingly, the areas of the decoders 984 and the gray scale voltage generation circuit 983 in FIG. 21 can be reduced, so that the chip area can be reduced.

Recently, in addition of the use of multiple bits, the higher definition of the liquid crystal display device is very much remarkable, so that the enormous number of pixels such as an XGA (1024 pixels×768 lines), an SXGA (1280 pixels× 1024 lines), and a UXGA (1600 pixels×1200 lines) must be driven. Then, with the higher definition, power consumption of the liquid crystal display device increases.

For this reason, power saving and voltage reduction have become very great challenges.

An example of a technique for reducing the power consumption of the data driver LSI is proposed in Patent Document 2 (JP Patent Kokai Publication No. JP-A-6-326529). FIG. 23 is a diagram showing a configuration described in the Patent Document 2. Referring to FIG. 23, this circuit includes a first differential pair 3210 and a second differential pair 3220. The first differential pair is constituted from N-ch transistors NM1 and NM2 with sources thereof connected in common to a constant current source. The second differential pair 3220 is constituted from P-ch transistors PM1 and PM2 with sources thereof connected in common to a constant current source. The pair of outputs of the first differential pair 3210 is connected to a high-potential power supply Vdd through a first load circuit (a current mirror circuit constituted from transistors PM3 and PM4). The pair of outputs of the second differential pair 3220 is connected to a low-potential power supply VSS through a second load circuit (a current mirror circuit constituted from transistors NM3 and NM4). The output terminal of the first load circuit (the drain of a PMOS transistor PM5 that constitutes the output terminal of a cascode current mirror) is connected to the gate of a PMOS transistor PM10. The source of the PMOS transistor PM10 is connected to the power supply Vdd, and the drain of the PMOS transistor PM10 is connected to the output terminal of the circuit. The output terminal of the second load circuit (the drain of an NMOS transistor NM5 that constitutes the output terminal of a cascode current mirror) is connected to the gate of an NMOS transistor NM10. The source of the NMOS transistor NM10 is connected to the power supply Vss and the drain of the NMOS transistor NM10 is connected to the output terminal. An output terminal Vout is feedback connected to the inverting input of the differential pairs, and a capacitor for preventing oscillation is connected to the output terminal Vout. Incidentally, reference numerals 3231 and 3232 denote floating current sources, for example. A differential amplifier of the configuration described above is the differential amplifier that can perform output over the full range of supplied voltages. Thus, such a differential amplifier 3200 is referred to as a "Rail-to-Rail amplifier (or also referred to as a "Rail-to-Rail Op Amp").

When the Rail-to-Rail amplifier as described above is employed as the buffer circuit, the range of supply voltages that is necessary for operating the amplifier is the same as the voltage range of liquid crystal elements to be driven. Thus, voltage reduction can be achieved, so that power saving can be implemented.

[Patent Document 1]
U.S. Pat. No. 6,246,351

[Patent Document 2]
JP Patent Kokai Publication No. JP-A-6-326529

SUMMARY OF THE DISCLOSURE

The following is consideration of a Rail-to-Rail amplifier 3200 including a plurality of differential pairs of same polarities as shown in FIG. 24, which uses a combination of two techniques. The following description is entirely based on the result of analysis by the inventor of the present invention.

In an example shown in FIG. 24, two input differential pairs are used, for the sake of convenience. When two input voltages Vin1 and Vin2 to be supplied to this amplifier are changed with their voltage difference maintained at 0.2V (in which the Vin1 is larger than the Vin2) and output accuracy is checked over the full range of supplied voltages, it can be seen that great errors are produced on the sides of the low-potential supply voltage Vss and the high-potential supply voltage Vdd, as shown in FIG. 25.

This means that, high-accuracy output of internally divided voltages cannot be performed using gray scales corresponding to voltage ranges in which the errors are produced, and this is a critical problem in the data driver that is required to perform high-accuracy voltage output.

The reason for this will be considered. The reason becomes as follows: When a voltage in the vicinity of the low-potential supply voltage is output in a configuration shown in FIG. 24, two N-ch differential pairs 3320 and 3310 will not operate one by one as the input voltages Vin1 and Vin2 are reduced more. During this process, one of the differential amplifiers may operate in a non-saturation region, while the other of the differential amplifiers may operate in a saturation region.

On the other hand, when a voltage in the vicinity of the high-potential supply voltage is output, two P-ch differential pairs 3330 and 3340 will not operate one by one as the input voltages Vin1 and Vin2 are increased more. During this process, one of the differential amplifiers may operate in the non-saturation region, while the other of the differential amplifiers may operate in the saturation region.

Even when the Vin1 is smaller than the Vin2, the similar phenomenon occurs. In this case, however, the order of the stop of the operations of the two differential pairs is reversed from the order described before.

Further, as the voltage difference between the Vin1 and the Vin2 is increased, the absolute value of the error is increased.

Accordingly, it is an object of the present invention to provide a Rail-to-Rail amplifier having a plurality of differential pairs of same polarities that can perform high-accuracy output over the full range of supplied voltages, a driver including the Rail-to-Rail amplifier, and a display device including the Rail-to-Rail amplifier.

The above and other objects are attained by the present invention generally configured as follows:

A differential amplifier according to one aspect of the present invention includes differential pairs of a first conductivity type and differential pairs of a second conductivity type each with one of an input pair thereof constituting an input terminal. The differential amplifier can perform output from an output terminal thereof over a full range of provided supply voltages. The differential amplifier includes:

a determination unit for determining whether to stop operations of the first differential pairs of the first conductivity type or operations of the second differential pairs of the second conductivity type upon receipt of at least one signal for determination; and a differential pair control unit for controlling activation and deactivation of the differential pairs of the first conductivity type and the differential pairs of the second conductivity type according to a result of determination by the determination unit.

In the present invention, the determination unit includes a comparator circuit for determining whether the level of the signal for determination is higher or lower than a predetermined value, and determines whether to stop the operations of the differential pairs of the first conductivity type or the operations of the differential pairs of the second conductivity type. In the present invention, the determination unit may receive an output signal of the differential amplifier as the signal for determination; and the determination unit may include a comparator circuit for determining whether the voltage of the output signal of the differential amplifier is higher or lower than a predetermined voltage and may determine whether to stop the operations of the differential pairs of the first conductivity type or the operations of the differential pairs of the second conductivity type.

In the present invention, the output pair of each of the differential pairs of the first conductivity type may be connected to a high-potential power supply through a first load circuit;

the output pair of each of the differential pairs of the second conductivity type may be connected to a low-potential power supply through a second load circuit;

the determination unit may receive an output signal of the differential amplifier as the signal for determination;

when the voltage of the output signal of the differential amplifier is in a range from the low-potential supply voltage to a first voltage higher than the low-potential supply voltage, it may be so controlled that the determination unit outputs a result of determination indicating that the operations of the differential pairs of the first conductivity type should be stopped;

when the voltage of the output signal of the differential amplifier is in a range from the high-potential supply voltage to a second voltage lower than the high-potential supply voltage and higher than the first voltage, it may be so controlled that the determination unit outputs a result of determination indicating that the operations of the differential pairs of the second conductivity type should be stopped; and when the voltage of the output signal of the differential amplifier is in a range between the first voltage and the second voltage, it may be so controlled that the determination unit outputs a result of determination indicating that both of the differential pairs of the first conductivity type and the differential pairs of the second conductivity type should be operated.

In the differential amplifier according to another aspect of the present invention, the determination unit may receive a polarity signal indicating the polarity of an output signal as the signal for determination; and when the polarity signal indicates a positive polarity, the operations of one of the differential pairs of the first conductivity type and the differential pairs of the second conductivity type may be stopped, and when the polarity signal indicates a negative polarity, the operations of the other of the differential pairs of the first conductivity type and the differential pairs of the second conductivity type may be stopped.

In the differential amplifier according to the present invention, the determination unit may receive the first and second signals for determination;

the second signal for determination may be constituted from a polarity signal indicating the polarity of an output signal;

the differential amplifier may include:

a first determination unit for determining whether the level of the input first signal for determination is higher or lower than a predetermined value; and a second determination unit for stopping the operations of the differential pairs of the second conductivity when the second signal for determination indicates a positive polarity and stopping the operations of the differential pairs of the first conductivity when the second signal for determination indicates a negative polarity; and a result of determination to the differential pair control unit may be output based on the result of determination by the first determination unit and the result of determination by the second determination unit.

The differential amplifier according to other aspect of the present invention may further include:

a delay unit for performing control so that the result of determination by the determination unit is supplied to the differential pair control unit with a delay of a predetermined time period.

A differential amplifier according to other aspect of the present invention includes differential pairs of a first conductivity type and differential pairs of a second conductivity type each with one of an input pair thereof constituting an input terminal. The differential amplifier can perform output from an output terminal thereof over a full range from a low-potential supply voltage to a high-potential supply voltage. The differential amplifier includes:

a control circuit for performing control so that at least in voltage segments in which an error of an output signal voltage from the output terminal may be produced, the error being in the vicinity of the high-potential supply voltage or the low-potential supply voltage, one of the differential pairs of the first conductivity type and the differential pairs of the second conductivity type that are responsible for the error are deactivated.

According to the present invention, at least in the voltage region in which an error is produced, the operations of the differential pairs of a polarity that are responsible for the error are stopped, thereby inhibiting the output error.

The differential amplifier according to other aspect of the present invention may further include:

a switching circuit for selectably supplying first and second input signal voltages to the non-inverting input terminals of the differential pairs of the first conductivity type and the differential pairs of the second conductivity type, respectively. Then, the output terminal may be feedback connected to the inverting-input terminals of the differential pairs of the first type and the differential pairs of the second type.

In the differential amplifier according to the present invention, a current source for driving each of the differential pairs of the first conductivity type or the differential pairs of second conductivity type controlled to be deactivated may be deactivated. Alternatively, in the differential pairs of the first conductivity type or the differential pairs of the second conductivity type controlled to be deactivated, propagation of outputs of the differential pairs to the output terminal of the differential amplifier may be inhibited.

A data driver for a display device according to other aspect of the present invention includes:

a gray scale voltage generation circuit for generating a plurality of voltage levels;

decoders including a plurality of output terminals, for outputting from the plurality of output terminals a plurality of voltages selected from among the plurality of voltage levels based on input data; and buffer circuits with input terminals thereof connected to the plurality of output terminals of the decoders, respectively, for outputting the voltages associated with the input data from output terminals thereof. Then, each of the buffer circuits comprises the differential amplifier described before.

The meritorious effects of the present invention are summarized as follows.

According to the present invention, a Rail-to-Rail amplifier having a plurality of differential pairs of same polarities that can perform high-accuracy output over the full range of supplied voltages can be provided.

Each decoder for outputting two input voltages to be selectively supplied to the amplifier can greatly reduce the number of input voltages (gray scale power supplies) and also greatly reduce the number of transistors. Area saving can be thereby implemented.

Further, according to the present invention, by using the Rail-to-Rail amplifier having a plurality of differential amplifiers of the same polarity and the decoder, a data driver LSI with the area thereof saved can be implemented at low cost.

Still further, lower cost of the display device including the data driver can also be implemented. Narrower frame of the display device can also be achieved.

Still other objects and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTION OF THE DRAWINGS

FIG. 17 is a table showing an output voltage and ON/OFF timings of differential pairs in the embodiment of the present invention;

FIG. 25 is a graph showing output accuracy in the configuration in FIG. 24.

PREFERRED EMBODIMENTS OF THE INVENTION

The embodiments of the present invention will be described.

First Embodiment

Figure 1:
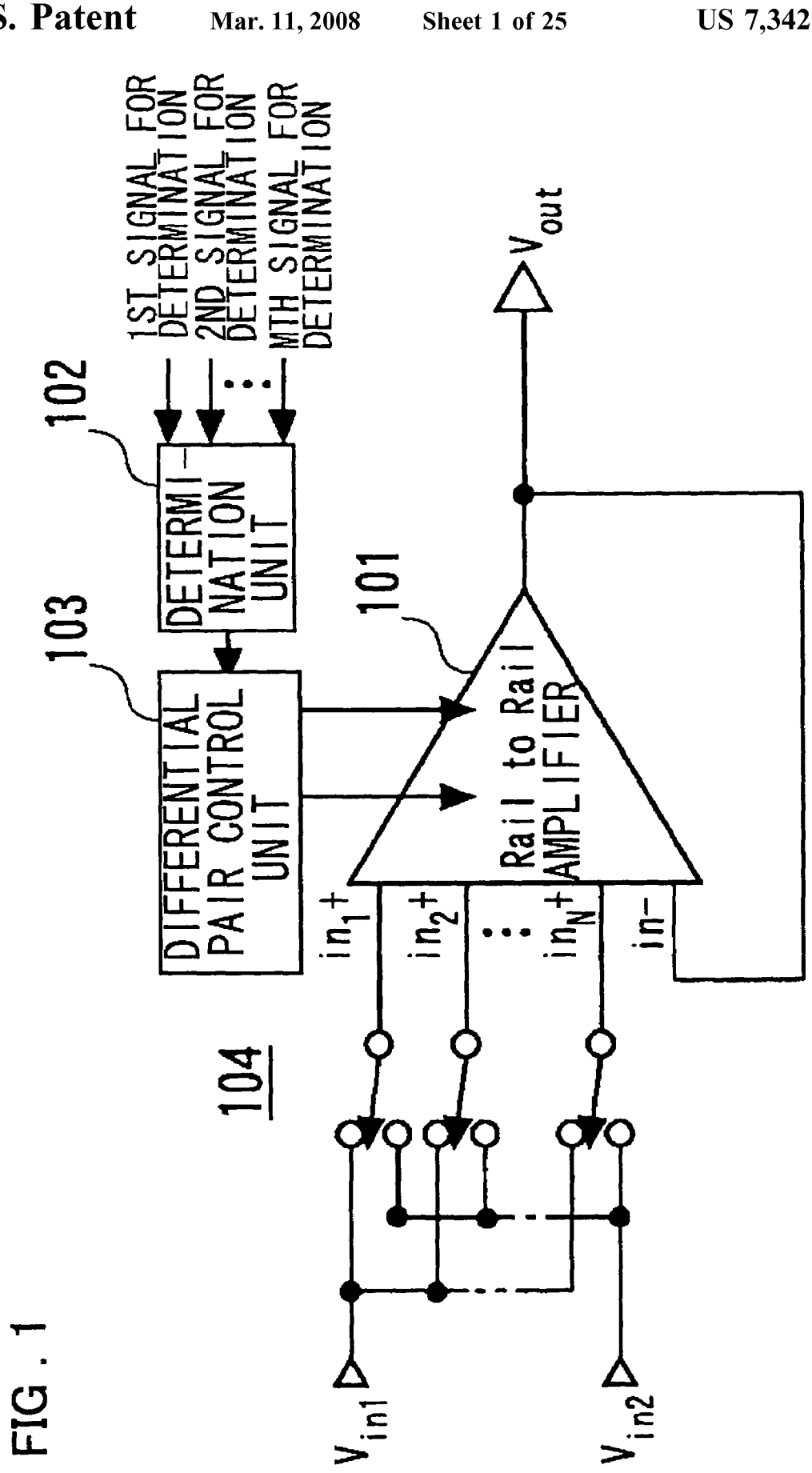
FIG. 1 is a diagram showing a configuration of a differential amplifier according to a first embodiment of the present invention.
Figure 22:
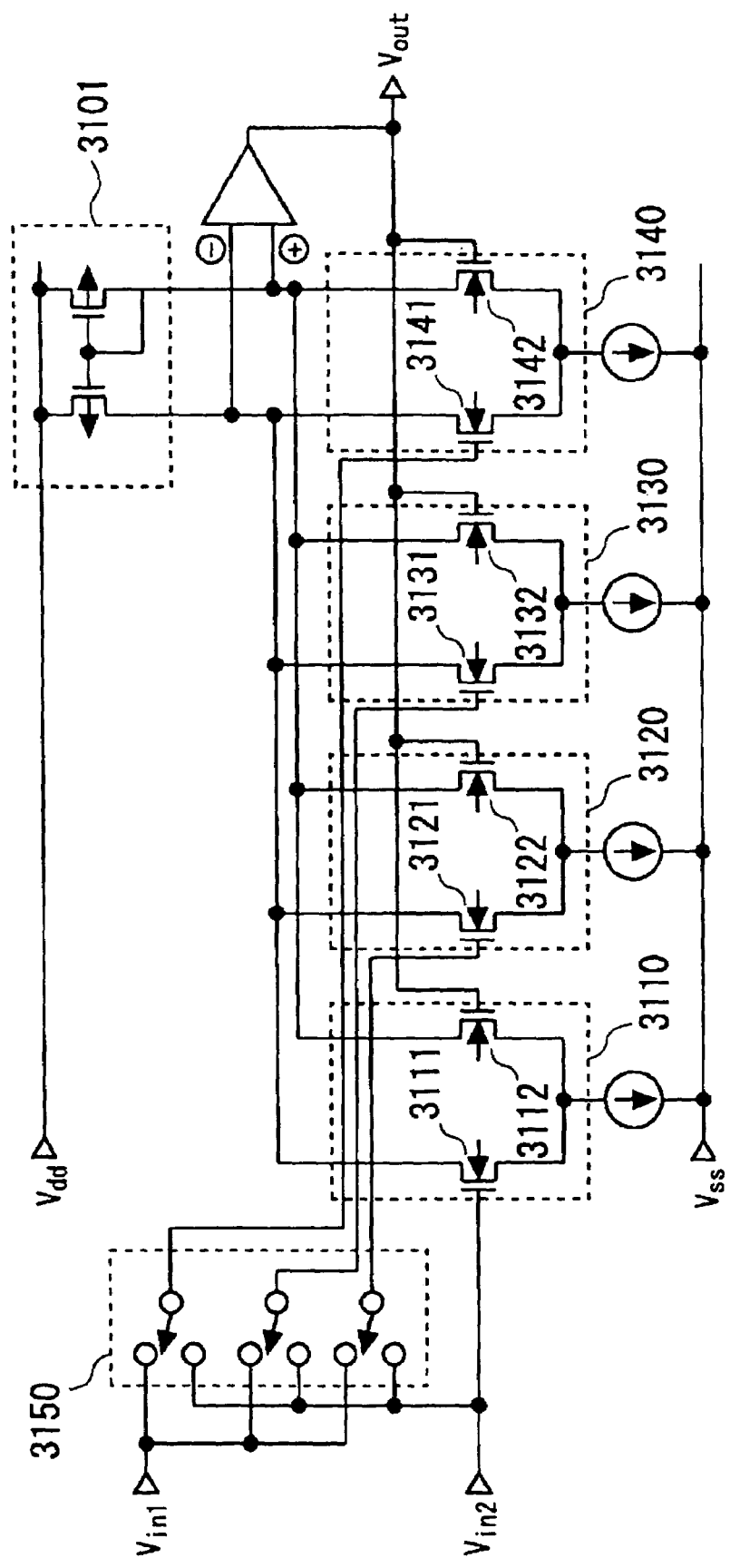
FIG. 22 is a diagram showing a configuration of a first prior art.
Figure 23:
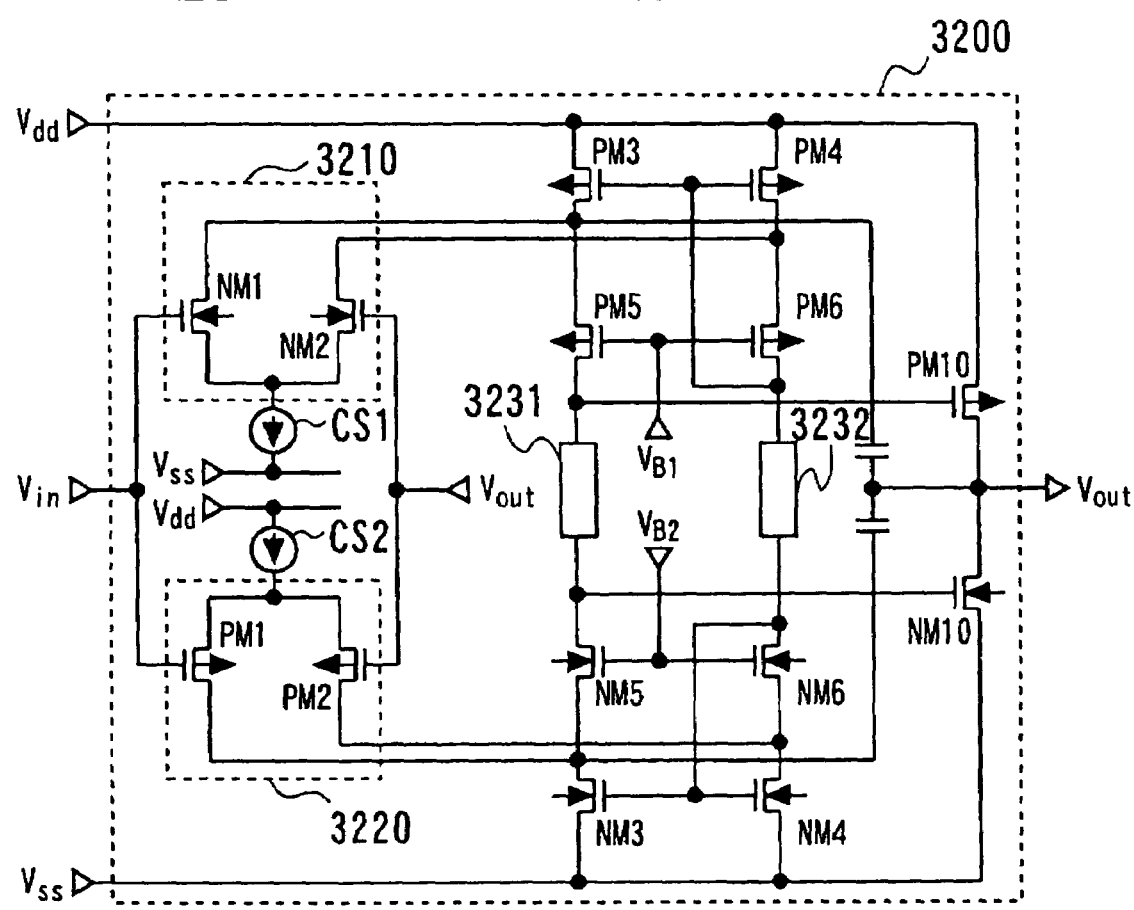
FIG. 23 is a diagram showing a configuration of a second prior art.
Figure 24:
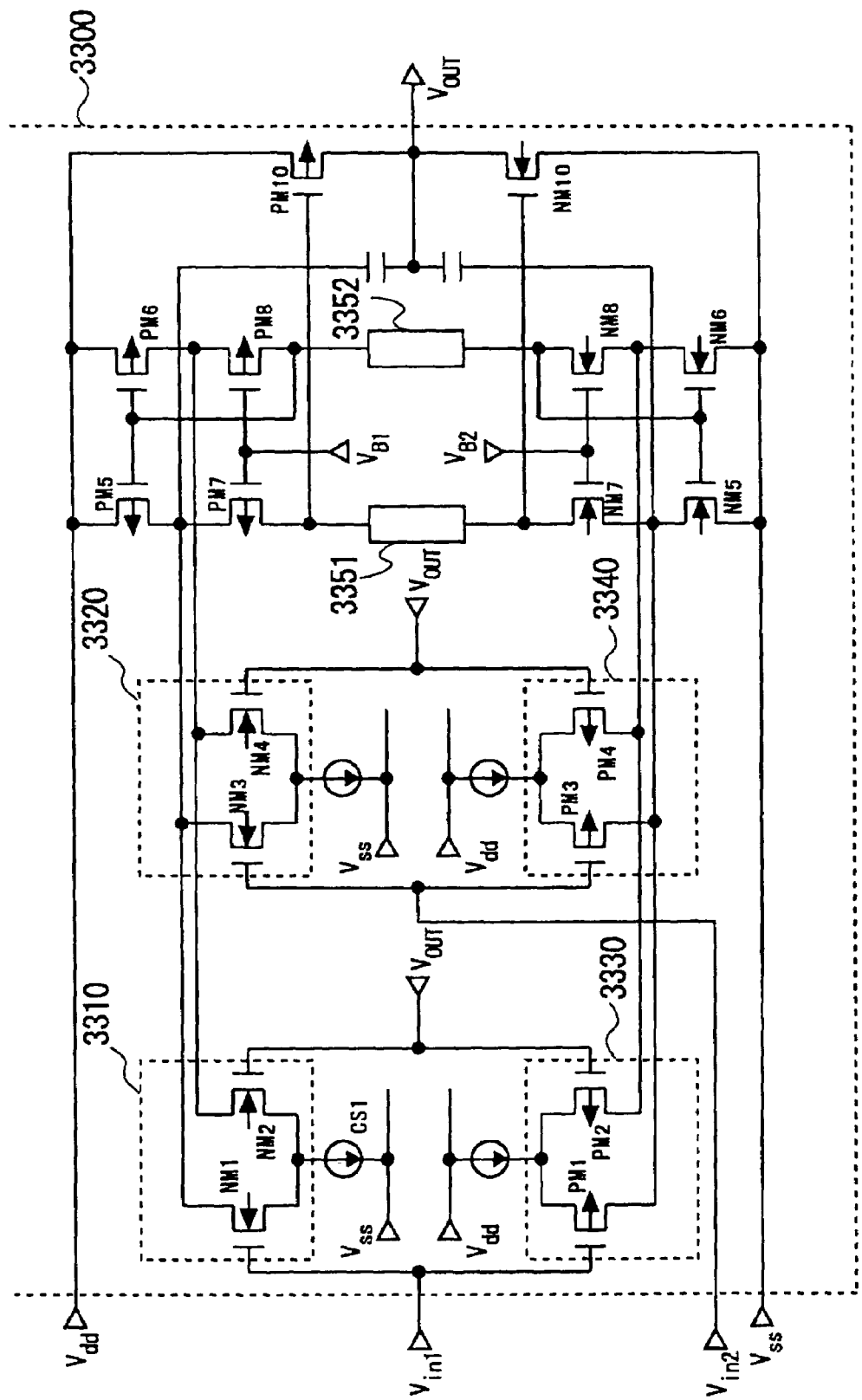
FIG. 24 is a diagram showing a configuration that combines the first prior art with the second prior art.

FIG. 1 is a diagram showing a configuration of a first embodiment of the present invention. Referring to FIG. 1, a differential amplifier according to this embodiment mode includes a Rail-to-Rail amplifier 101 having a plurality of differential pairs of same polarities, a determination unit 102, and a differential pair control unit 103. The determination unit 102 determines whether to stop the differential pairs or not according to M signals for determination (in which M is a predetermined positive integer) including an output voltage. The differential pair control unit 103 controls to operate or stop the differential pairs. By the way, the Rail-to-Rail amplifier 101 in this embodiment can be applied to the Rail-to-Rail amplifier having an arbitrary configuration including a plurality of differential pairs of the same polarities, such as an amplifier 3300 shown in FIG. 24. Incidentally, a switch 104 has the same function as a switch 3150 described with reference to FIG. 22. Either of the Vin1 and the Vin2 is supplied to the non-inverting input of each of the differential pairs through the switch 104, and the output voltage Vout is feedback connected to its inverting input. According to the number of inputs of the Vin1 and the Vin2 supplied to the non-inverting inputs of the differential pairs, voltages obtained by performing the interior division between the voltages Vin1 and Vin2 by an arbitrary interior division ratio can be output.

In this embodiment, the determination unit 102 determines whether the Rail-to-Rail amplifier 101 is in a state where an error is produced or not according to one of the signals for determination, and outputs, for example, one of the following three results of determination indicating that:

N-ch differential pairs should be stopped;

P-ch differential pairs should be stopped; and

Neither the N-ch differential pairs nor the P-ch differential pairs should be stopped (and should be in an operation state);

The signals indicating the results of determination are two-bit digital signals, for example, and are set as follows, as shown in Table 1:

TABLE 1

| Signal Value | Meaning of Signal |
| --- | --- |
| 00 | Stop N-ch differential pairs |
| 01 | Don't Stop either N-ch differential pairs or P-ch differential pairs |
| 11 | Stop P-ch differential pairs |

Alternatively, when the following two results of determination indicating that:

the N-ch differential pairs should be stopped; and the P-ch differential pairs should be stopped;

may be made, one-bit digital signals should be used, and the one-bit digital signals are set as follows, as shown in Table 2:

TABLE 2

| Signal Value | Meaning of Signal |
| --- | --- |
| 0 | Stop N-ch differential pairs |
| 1 | Stop P-ch differential pairs |

The differential pair control unit 103 has the function of controlling turning ON/OFF of the N-ch differential pairs and the P-ch differential pairs, based on the result of determination by the determination unit 102.

As the ON/OFF control over the differential pairs, it may be so configured that activation/deactivation of current sources 211 and 212 for driving a differential pair 201 and activation/deactivation of current sources 221 and 222 for driving a differential pair 202 are controlled. That is, when the result of determination by the determination unit 102 indicates that "the P-ch differential pairs should be stopped", the current sources 221 and 222 for driving the P-ch differential pair 202 are deactivated, and the current sources 211 and 212 for driving the N-ch differential pair 201 are activated.

When the result of determination by the determination unit 102 indicates that "the N-ch differential pairs should be stopped", the current sources 211 and 212 for driving the N-ch differential pair 201 are deactivated, and the current sources 221 and 222 for driving the P-ch differential pair 202 are activated.

When the result of determination by the determination unit 102 indicates that "both of the N-ch differential pairs and the P-ch differential pairs should be stopped", the current sources 211, 212, 221, and 222 for driving the differential pairs 201 and 202 are all activated.

As an alternative configuration for controlling the differential pairs, it may be so configured that a switch is provided between the outputs of the differential pairs and an amplification stage, and when the differential pairs are turned off, the switch is turned OFF so that the outputs of the differential pairs are not transmitted to the amplification stage.

According to the present embodiment, in a voltage region in which an error is produced, the differential pairs that are responsible for the error are stopped. Accordingly, over the full range of output voltages, high-accuracy output becomes possible.

Second Embodiment

Figure 3:
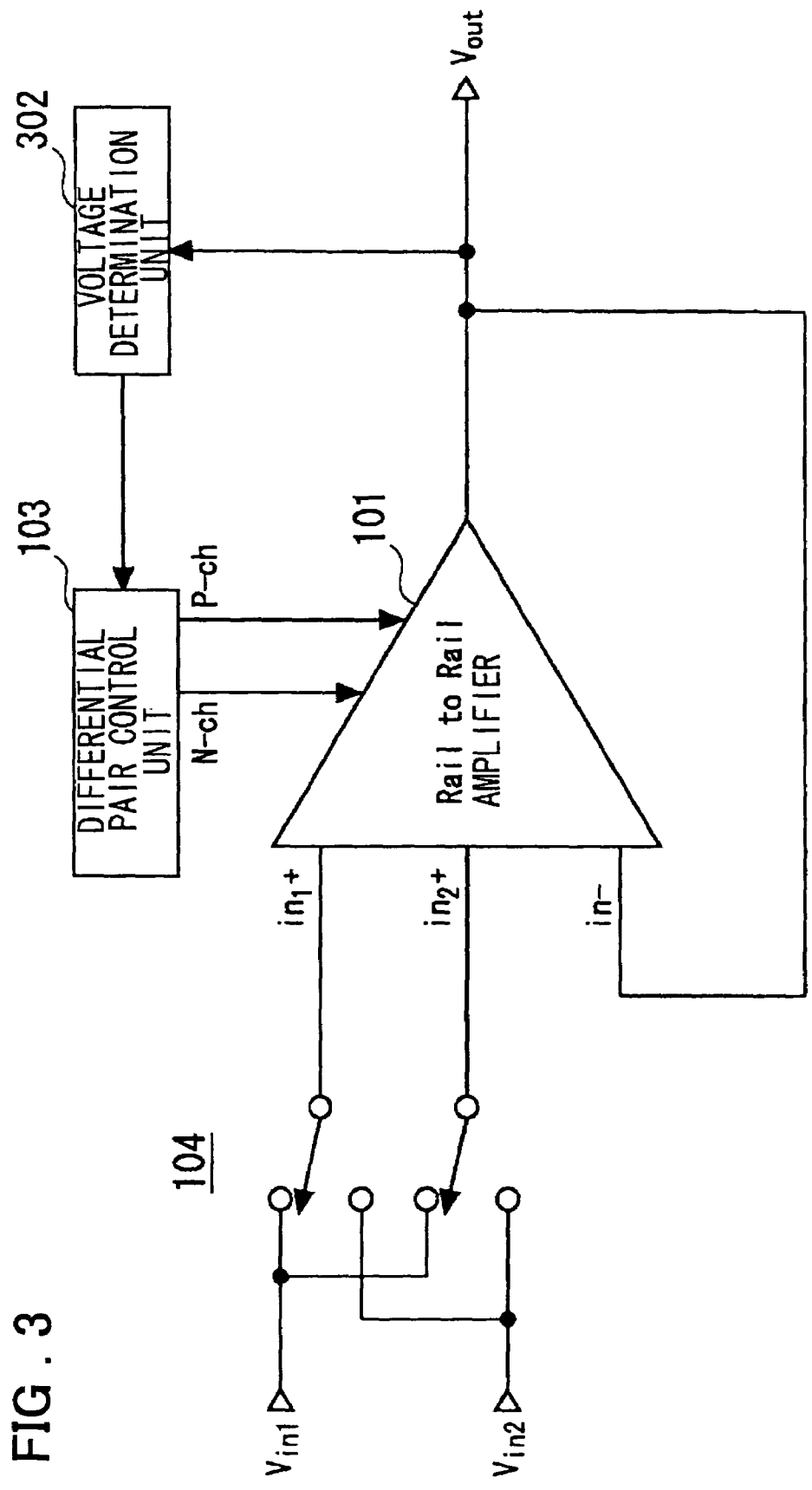
FIG. 3 is a diagram showing a configuration of a differential amplifier according to a second embodiment of the present invention.

FIG. 3 is a diagram showing a configuration of a second embodiment of the present invention. The second embodiment of the present invention will be described, using FIG. 3. The second embodiment of the present invention is obtained by replacing the determination unit in the first embodiment by a voltage determination unit 302.

An operation of the present embodiment will be described. In the following description, the output voltage will be set to Vout, an error-producing voltage on a low-potential supply voltage side, at which an error on the low-potential supply voltage side is produced, will be set to be in a range from a Vss to a VSN, and an error-producing voltage on a high-potential supply voltage side, at which an error on the high-potential supply voltage side is produced, will be set to be in a range from the VSP to a Vdd.

Figure 2:
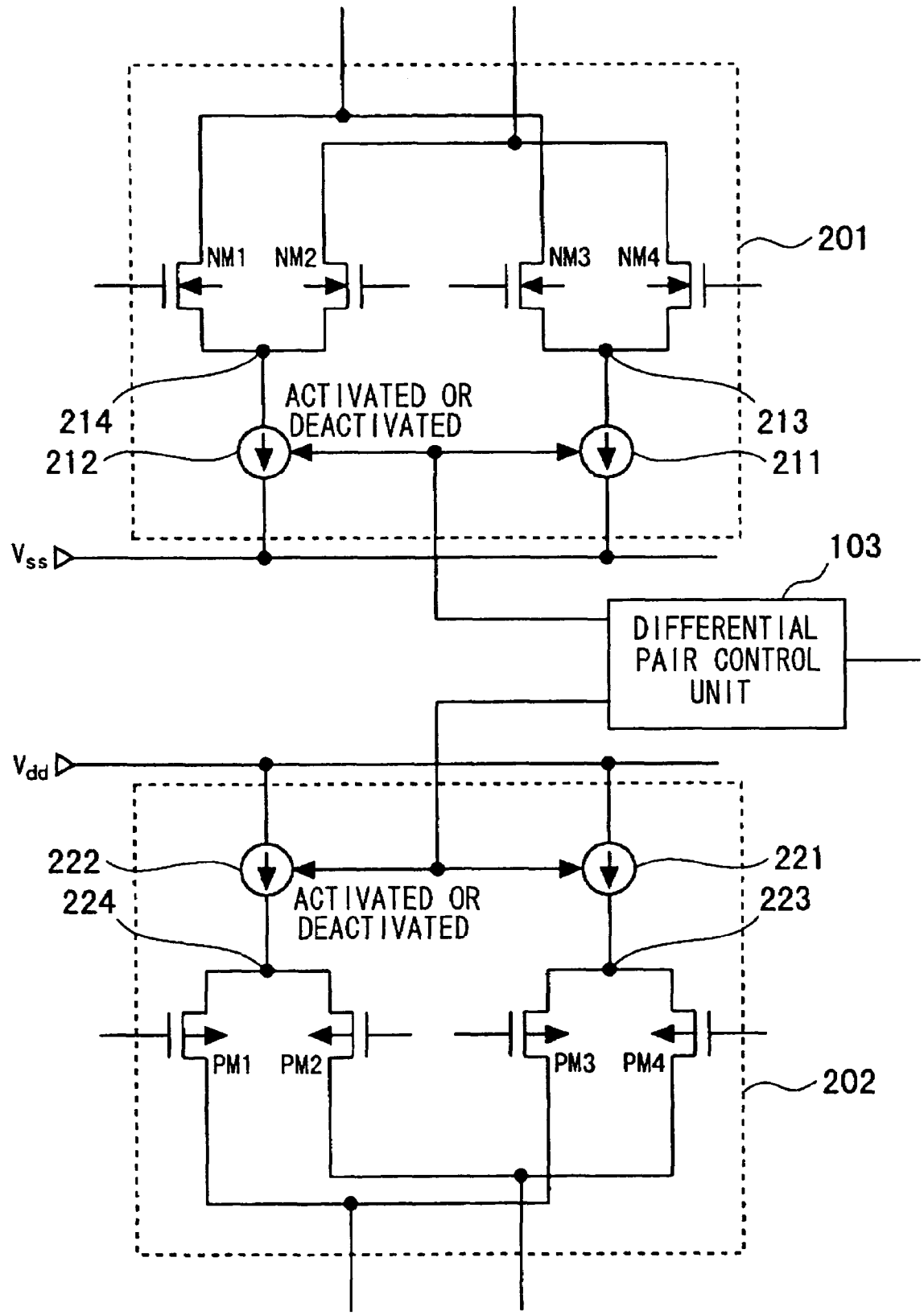
FIG. 2 is a diagram showing an example of a control method of differential pairs in the first embodiment of the present invention.

First, a voltage that changes in the form of a monotonous increase or a monotonous decrease according to the output voltage Vout is supplied to the voltage determination unit 302 as a reference voltage Vref. The reference voltage Vref may be the voltage that changes according to the output voltage Vout, and may be an input voltage Vin1 or Vin2 for the amplifier, the source voltage of the amplifier differential pair (the voltage of one of common source nodes 213, 214, 223, and 224 in FIG. 2), or the output voltage Vout itself.

When the relationship between the Vout and the Vref is represented by an equation of Vref=F(Vout), definitions as follows are made:

Vref1N=Min{F(Vss), F(VSN)},
Vref2N=Max{F(Vss), F(VSN)},
Vref1P=Min{F(VSP), F(Vdd)},
Vref2P=Max{F(VSP), F(Vdd)}

(in which Min{ }, Max{ } indicate the minimum value and the maximum value in the braces of { }, respectively).

Then, it can be determined that when the reference voltage Vref is in the range from the Vref1N and the Vref2N, the Vout is in the range of the error-producing voltage on the low-potential supply voltage side. It can also be determined that when the reference voltage Vref is in the range from the Vref1P to the Vref2P, the Vout is in the range of the error-producing voltage on the high-potential supply voltage side is produced.

When the reference voltage Vref is in these ranges, the differential pairs that are responsible for the error should be stopped. Thus, the voltage determination unit 302 outputs the result of determination as follows:

"when Vref1N≦Vref≦Vref2N, stop the N-ch differential pairs";

"when Vref1P≦Vref≦Vref2P, stop the P-ch differential pairs"; or otherwise, "do not stop either the N-ch differential pairs or the P-ch differential pairs".

Since the operation of the differential pair control unit 103 is the same as that in the first embodiment, its description will be omitted.

Figure 4:
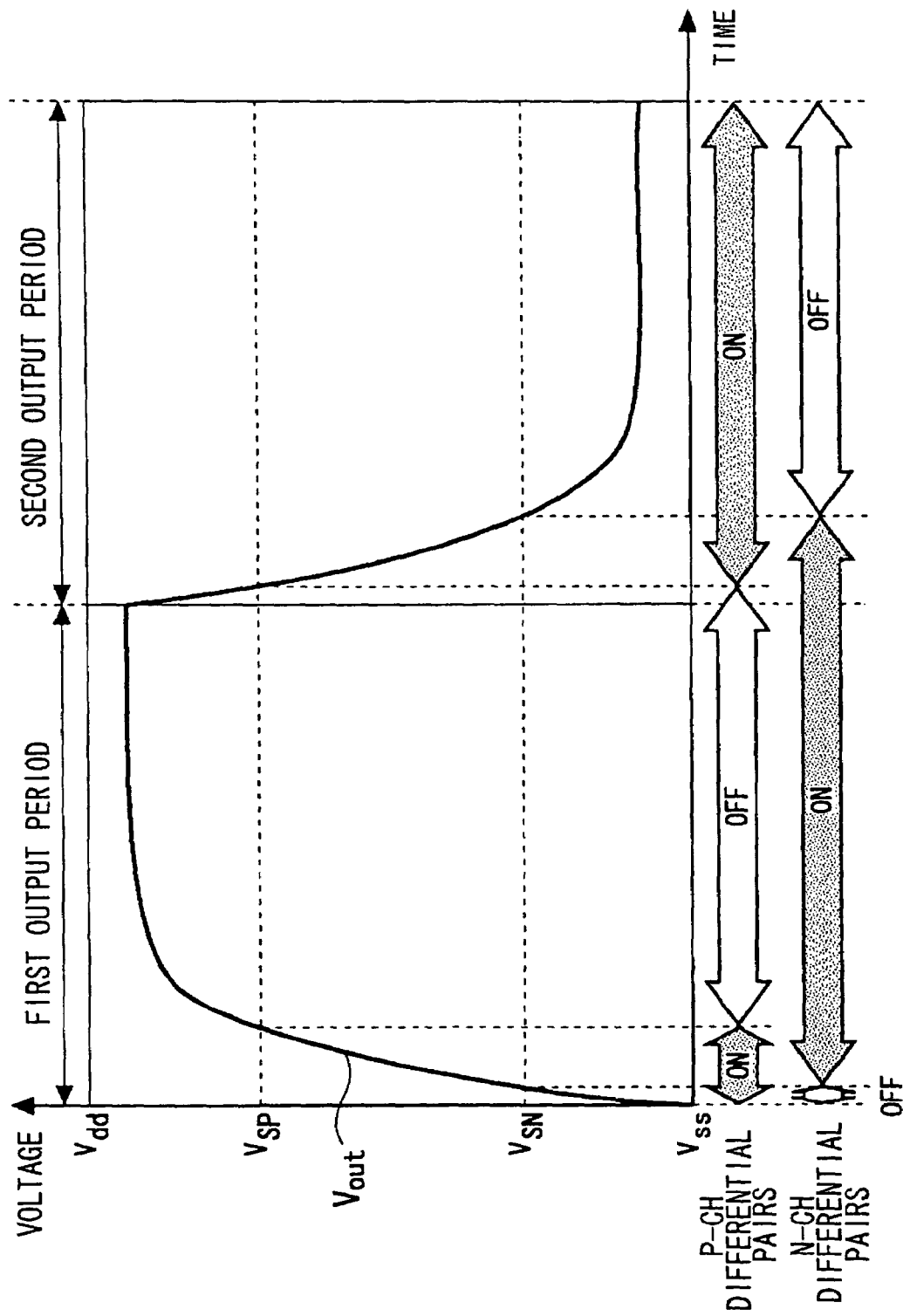
FIG. 4 is a graph showing ON/OFF timings of differential pairs in the second embodiment of the present invention.

The ON/OFF timings of the differential pairs when the Vout is changed from the error-producing voltage on the high-potential power supply side to the error-producing voltage on the low-potential power supply side becomes the ones as shown in FIG. 4. In this example, as the reference voltage Vref, the Vout is used without alteration.

First, in a first output period, until the Vout gets out of the error-producing voltage on the low-potential supply voltage side (or when Vss≦Vout≦VSN), the N-ch differential pairs are stopped. Then, the Vout reaches a voltage at which no error is produced, so that driving is performed using both of the P-ch differential pairs and the N-ch differential pairs.

When the Vout reaches the error-producing voltage on the high-potential supply voltage side or when VSP≦Vout≦Vdd, the P-ch differential pairs are then stopped, so that driving is performed using the N-ch differential pairs alone.

Next, in a second output period, until the Vout gets out of the error-producing voltage on the high-potential supply voltage side, the P-ch differential pairs are stopped. Then, the Vout reaches the voltage at which no error is produced, so that driving is performed using both of the P-ch differential pairs and the N-ch differential pairs.

When the Vout reaches the error-producing voltage on the low-potential supply voltage side, the N-ch differential pairs are then stopped, so that driving is performed using the P-ch differential pairs alone.

Hence, according to the present embodiment,

When the output voltage is in the range of the error-producing voltage on the high-potential supply voltage side, the P-ch differential pairs that are responsible for the error on the high-potential supply voltage side are stopped; and When the output voltage is in the range of the error-producing voltage on the low-potential supply voltage side, the N-ch differential pairs that are responsible for the low-potential supply voltage side are stopped.

For this reason, over the full range of output voltages, high-accuracy output becomes possible.

The voltage determination unit 302 can be configured by using a known art such as the one which employs a comparator (voltage comparator) or the like.

Figures 5A, 5B:
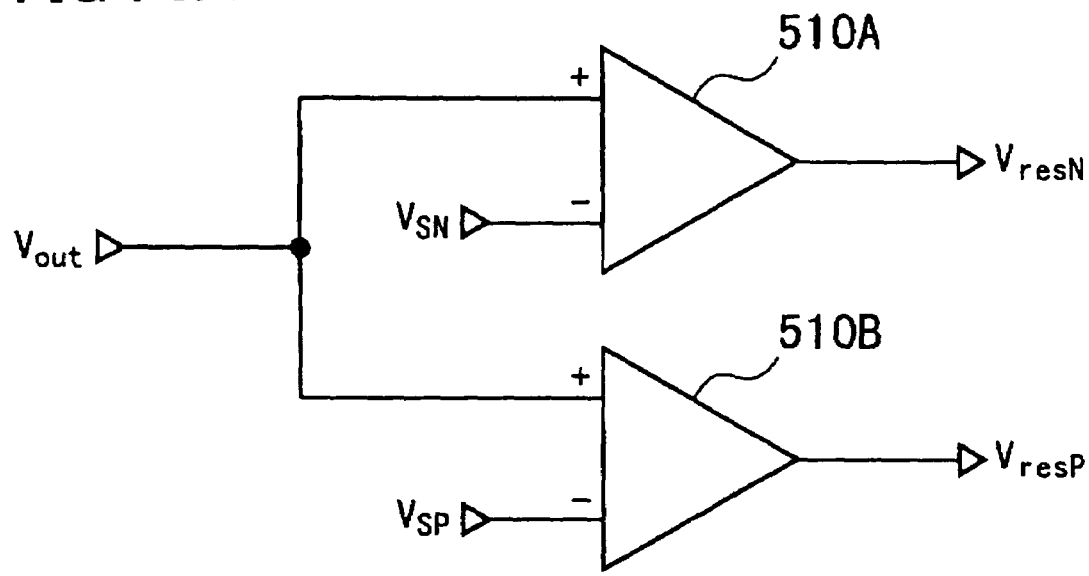
FIGS. 5A and 5B include a diagram showing a configuration using a comparator as a specific example of a voltage determination unit.

As a specific example of the voltage determination unit, a circuit that uses two comparators 510A and 510B as shown in FIGS. 5A and 5B will be considered. In this example as well, the Vref is set to be equal to the Vout.

When the Vout is connected to each of the non-inverting inputs of the two comparators 510A and 510B, and when the VSN and the VSP are coupled to each of the inverting inputs of the two comparators 510A and 510B, respectively, it can be determined as follows:

When (VresN, VresP)=(Low, Low),
Vout≦VSN,
When (VresN, VresP)=(High, High),
VSP≦Vout.

Third Embodiment

Figure 6:
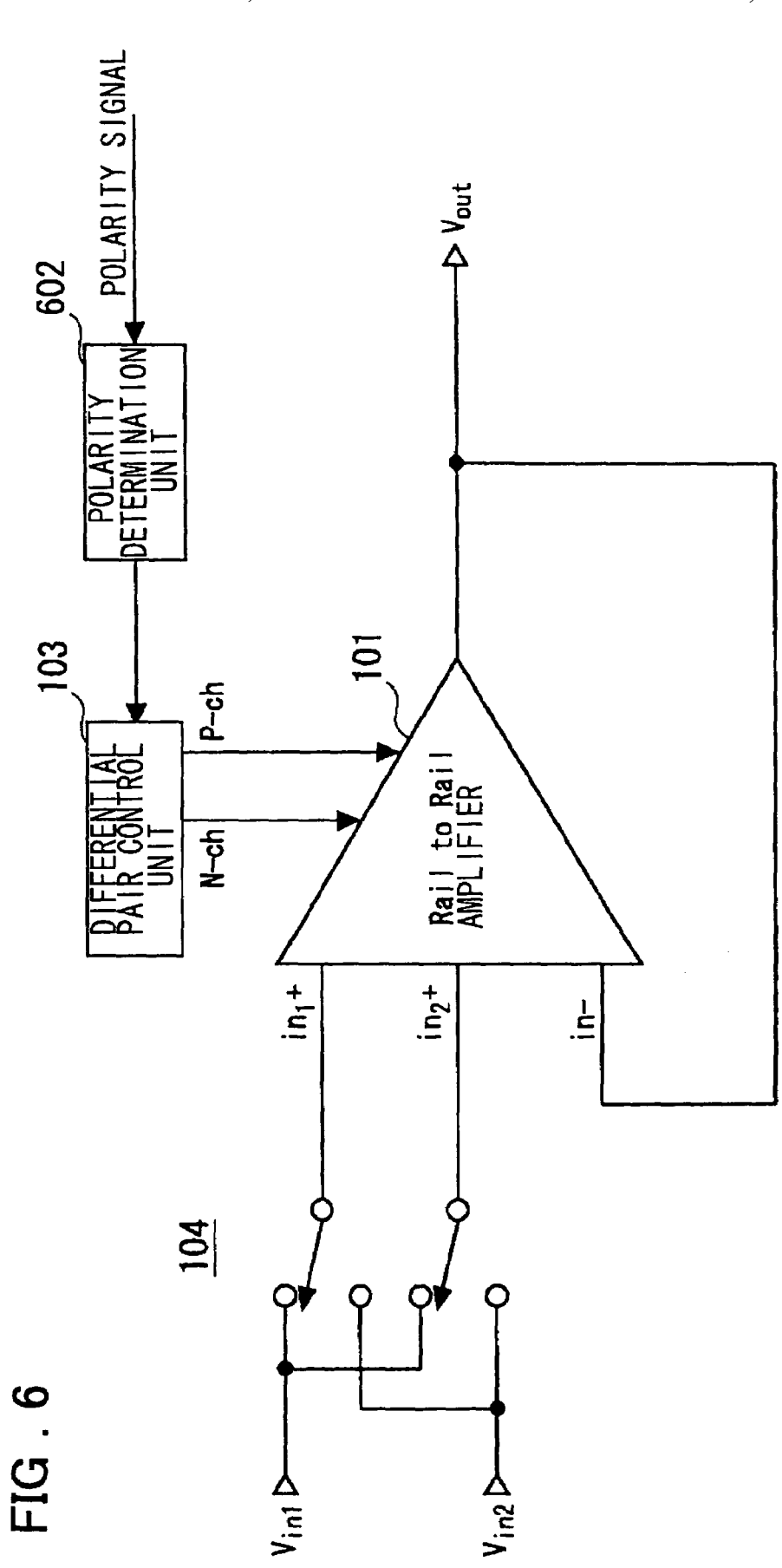
FIG. 6 is a diagram showing a configuration of a differential amplifier according to a third embodiment of the present invention.

Next, a third embodiment of the present invention will be described, using FIG. 6. Referring to FIG. 6, the third embodiment is obtained by replacing the determination unit in the first embodiment by a polarity determination unit 602.

In order to describe the present embodiment, a polarity signal in a liquid crystal display device will be briefly described, first. In the liquid crystal display device, a driving method in which the polarity of a voltage applied to each liquid crystal element is reversed every certain period is generally employed.

Figure 7:
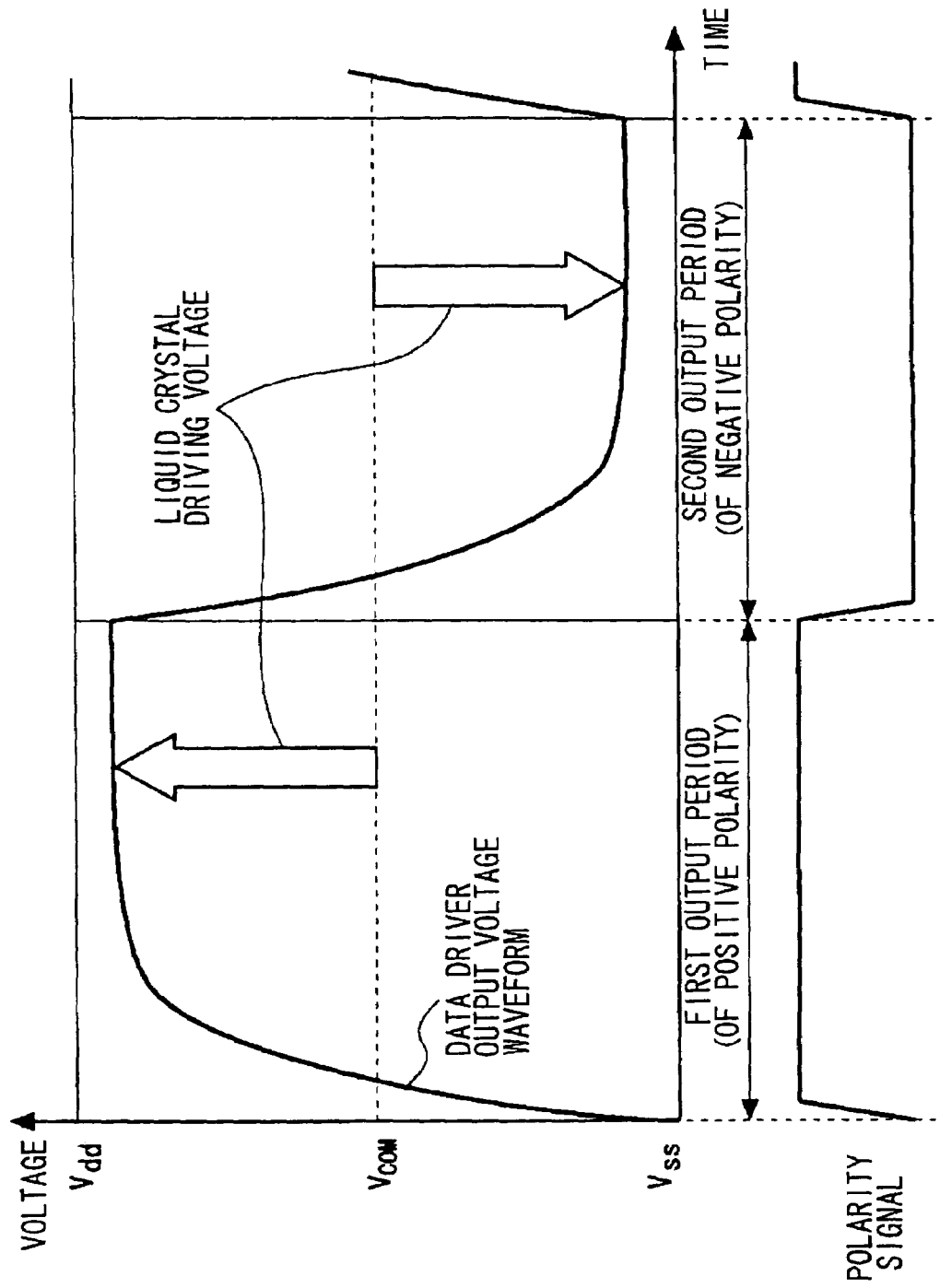
FIG. 7 is a graph explaining a liquid crystal driving voltage and polarity of a liquid crystal display device.

Then, as shown in FIG. 7, a period in which a positive voltage is applied to a common voltage Vcom (the voltage of an opposed electrode of a TFT substrate) is referred to as a "positive polarity period", while a period in which a negative voltage is applied to the common voltage Vcom is referred to as a "negative polarity period".

To the data driver of the liquid display device, the signal (polarity signal) synchronized with reversal of the polarity, as shown in FIG. 7, is input, and this signal controls the polarity of a liquid crystal driving voltage.

In the present embodiment, using the polarity signal as the signal for determination, the polarity determination unit 602 outputs the following result of determination indicating that:

when the polarity signal is positive, the "P-ch differential pairs should be stopped" in order to suppress the error on the high-potential supply voltage side; or when the polarity signal is negative, the "N-ch differential pairs should be stopped" in order to suppress the error on the low-potential supply voltage side.

Since the operation of the differential pair control unit 103 is the same as that in the first embodiment, its description will be omitted.

In the Rail-to-Rail amplifier 101 according to the present embodiment of the present invention, by the operations described above, driving using only the N-ch differential pairs is performed when the polarity signal is positive, and driving using only the P-ch differential pairs is performed when the polarity signal is negative.

Figure 8:
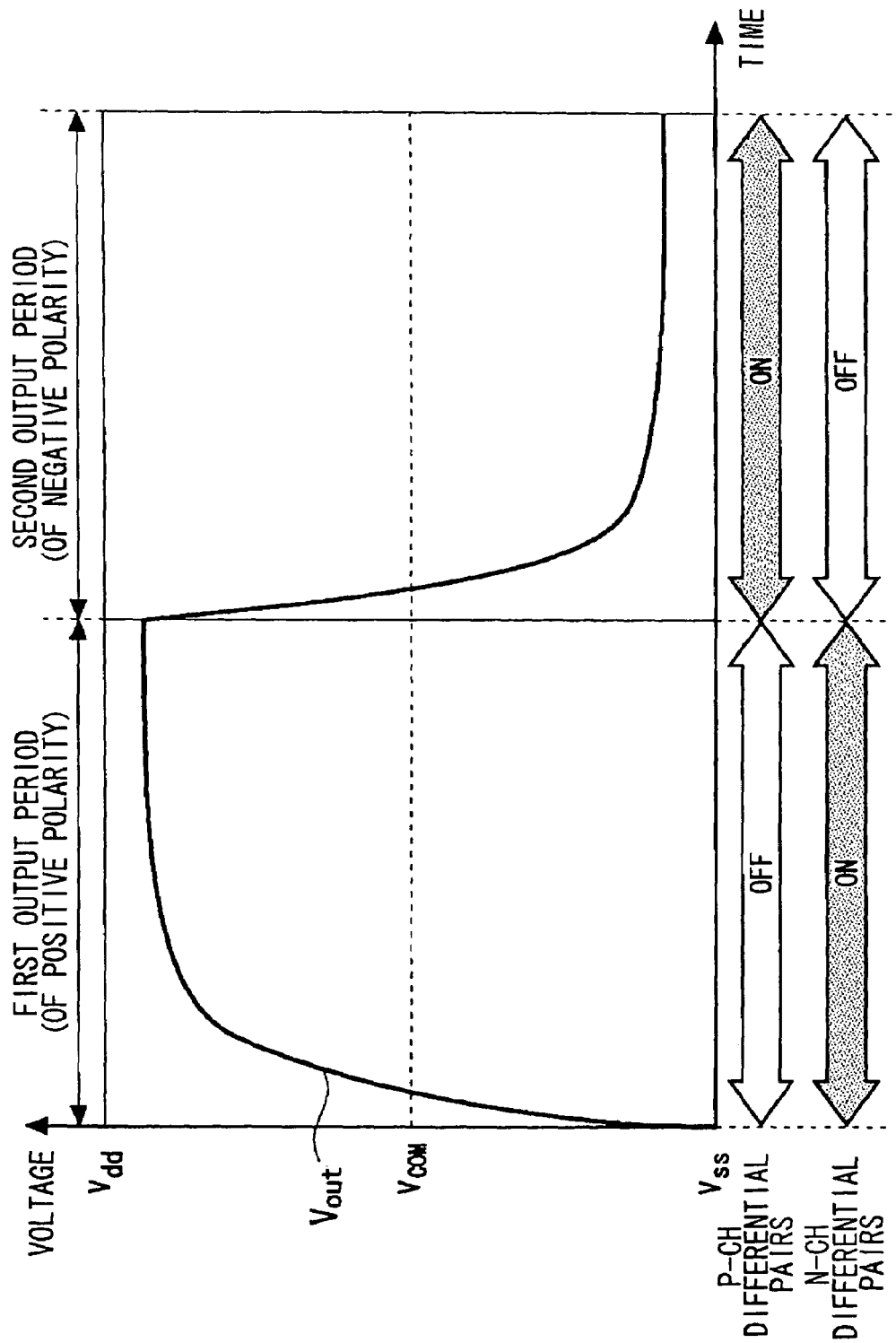
FIG. 8 is a graph showing ON/OFF timings of differential pairs in the third embodiment of the present invention.

In the present embodiment, the ON/OFF timings of the differential pairs when the output voltage Vout is changed from the error-producing voltage on the high-potential supply voltage side to the error-producing voltage on the low-potential supply voltage side become those as shown in FIG. 8.

Referring to FIG. 8, the first output period is set to be the positive polarity period, while the second output period is set to be the negative polarity period. As described before, in the first output period (of positive polarity), the P-ch differential pairs are always stopped irrespective of the output voltage Vout. Thus, driving is performed using the N-ch differential pairs alone.

In the second output period (of negative polarity), the N-ch differential pairs are always stopped irrespective of the output voltage Vout. Thus, driving is performed using the N-ch differential pairs alone.

Hence, according to the present embodiment, when the polarity signal is positive, the P-ch differential pairs that are responsible for the error on the high-potential supply voltage side are stopped. When the polarity signal is negative, the N-ch differential pairs that are responsible for the error on the side of the low-potential supply voltage are stopped. For this reason, high-accuracy output over the full range of output voltages becomes possible.

Fourth Embodiment

Figure 9:
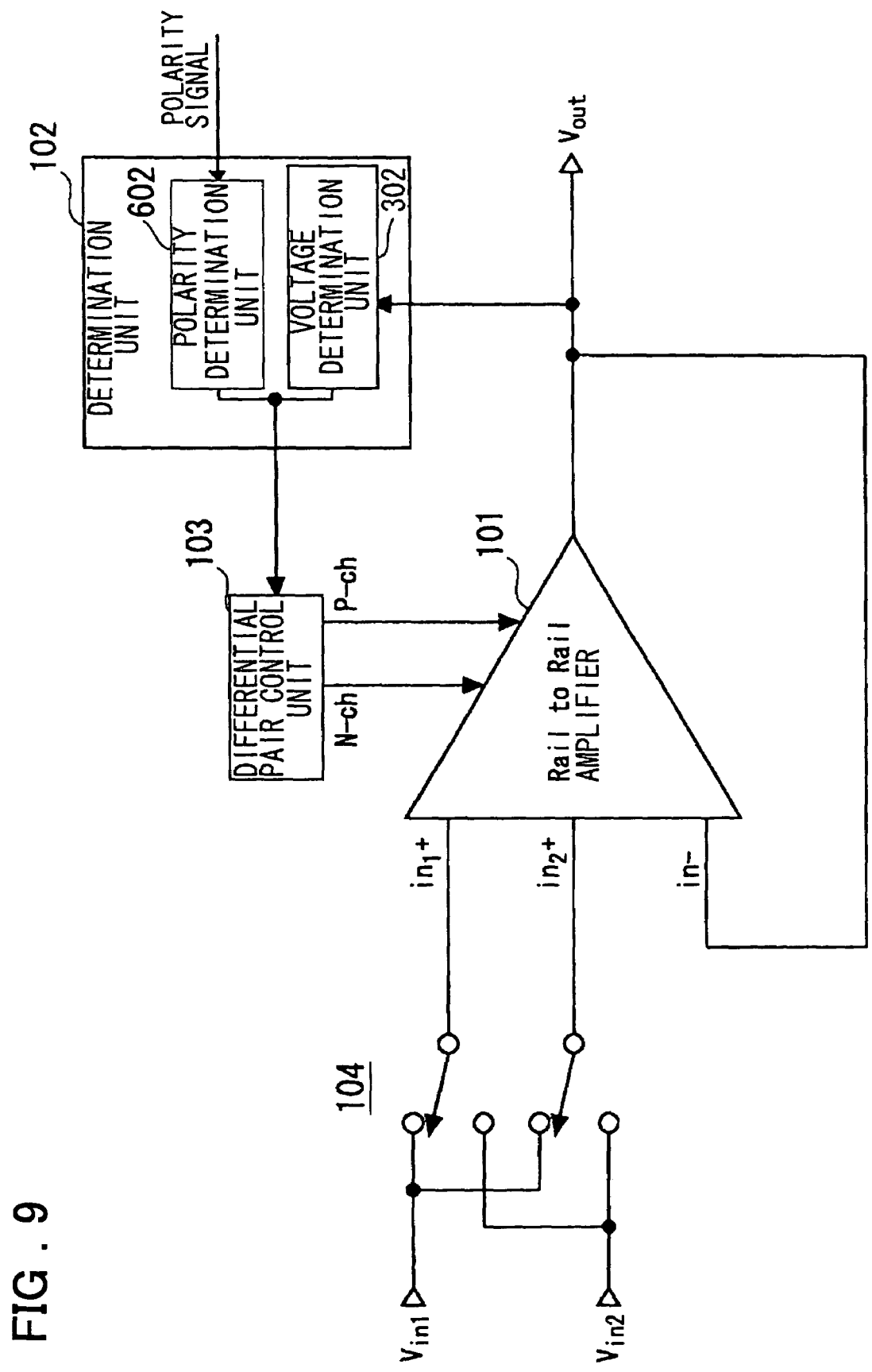
FIG. 9 is a diagram showing a configuration of a differential amplifier according to a fourth embodiment of the present invention.

Next, a fourth embodiment of the present invention will be described with reference to FIG. 9. Referring to FIG. 9, the determination unit 102 in the present embodiment includes the voltage determination unit 302 and the polarity determination unit 602. In the present embodiment, the differential pairs are controlled using two signals constituted from the signal indicating the voltage and the polarity signal.

The voltage for determination to be supplied to the voltage determination unit 302 may be arbitrary, if the voltage for determination is the voltage that changes according to the output voltage Vout, as described in the second embodiment. Herein, the output voltage Vout is taken as the voltage for determination, for the sake of convenience.

The polarity signal to be supplied to the polarity determination unit 602 is the same as that described in the third embodiment.

As in the second embodiment, the voltage determination unit 302 in the present embodiment outputs the result of determination indicating as follows:

when the output voltage Vout is the in the range of the error-producing voltage on the high-potential supply voltage side, "the P-ch differential pairs should be stopped";

when the output voltage Vout is in the range of the error-producing voltage on the low-potential supply voltage side, "the N-ch differential pairs should be stopped", or otherwise, "either the N-ch differential pairs or the P-ch determination pairs should not be stopped".

As in the third embodiment, the polarity determination unit 602 outputs the result of determination indicating as follows:

stop the P-ch differential pairs", when the polarity signal is positive; or stop the N-ch differential pairs", when the polarity signal is negative.

Based on the results of determination by the voltage determination unit 302 and the polarity determination unit 602, the determination unit 102 outputs the result of final determination.

When the results of the determination by the voltage determination unit 302 and the polarity determination unit 602 are the same, for example, the determination unit 102 outputs the same result of determination.

Otherwise (when the results of determination by the voltage determination unit 302 and the polarity determination unit 602 are not the same), the determination unit 102 outputs the result indicating that either the N-ch differential pairs or the P-ch differential pairs should not be stopped.

The final result of determination may be made by using the method other than the one described above. The determination unit 102 may output, for example, one of the following results of determination indicating that:

"the P-ch differential pairs should be stopped" when both of the results of determination by the voltage determination unit 302 and the polarity determination 602 indicate that "the P-ch differential pairs should be stopped";

"the N-ch differential pairs should be stopped", irrespective of the result of determination by the voltage determination unit, when the result of determination by the polarity determination 302 indicates that "the N-ch differential pairs should be stopped"; and either the N-ch differential pairs or the P-ch differential pairs should not be stopped, otherwise.

The differential pair control unit 103 operates to control the differential pairs based on the result of determination, as in the first embodiment.

With this configuration, in the present embodiment, when the output voltage Vout is in the range of the error-producing voltage on the high-potential supply voltage side and the polarity of the polarity signal is positive, the P-ch differential pairs are stopped, or when the output voltage Vout is in the range of the error-producing voltage on the low-potential supply voltage side and the polarity of the polarity signal is negative, the N-ch differential pairs are stopped.

Figure 10:
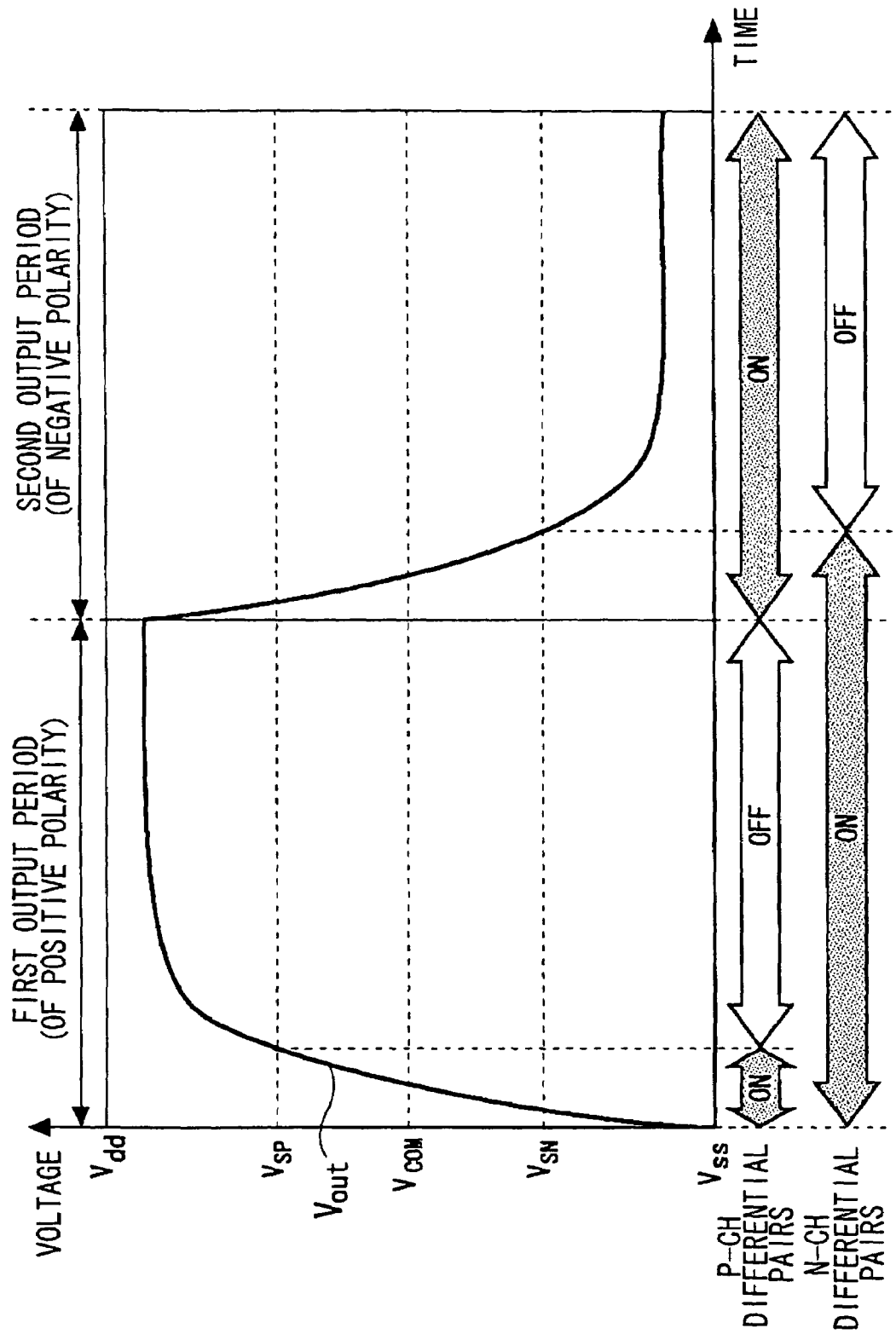
FIG. 10 is a graph showing ON/OFF timings of differential pairs in the fourth embodiment of the present invention.

In the present embodiment, the ON/OFF timings of the differential pairs when the Vout is changed from the error-producing voltage on the high-potential supply voltage side to the error-producing voltage on the low-potential supply voltage side become those as shown in FIG. 10. As in FIG. 8, the first output period is set to be the positive polarity period, while the second output period is set to be the negative polarity period.

It can be seen that during the rising period in which the Vout gets out of the error-producing voltage on the low-potential supply voltage side and during the falling period in which the Vout gets out of the error-producing voltage on the side of the high-potential supply voltage side, driving is performed using both of the N-ch differential pairs and the P-ch differential pairs.

Hence, according to the present embodiment, high-accuracy output becomes possible over the full range of output voltages. In addition, driving using both of the N-ch differential pairs and the P-ch differential pairs is performed during the rising/falling period in which the Vout gets out of the error producing voltages.

For this reason, slew rate can be improved more than in the second and third embodiments.

Fifth Embodiment

Figure 11:
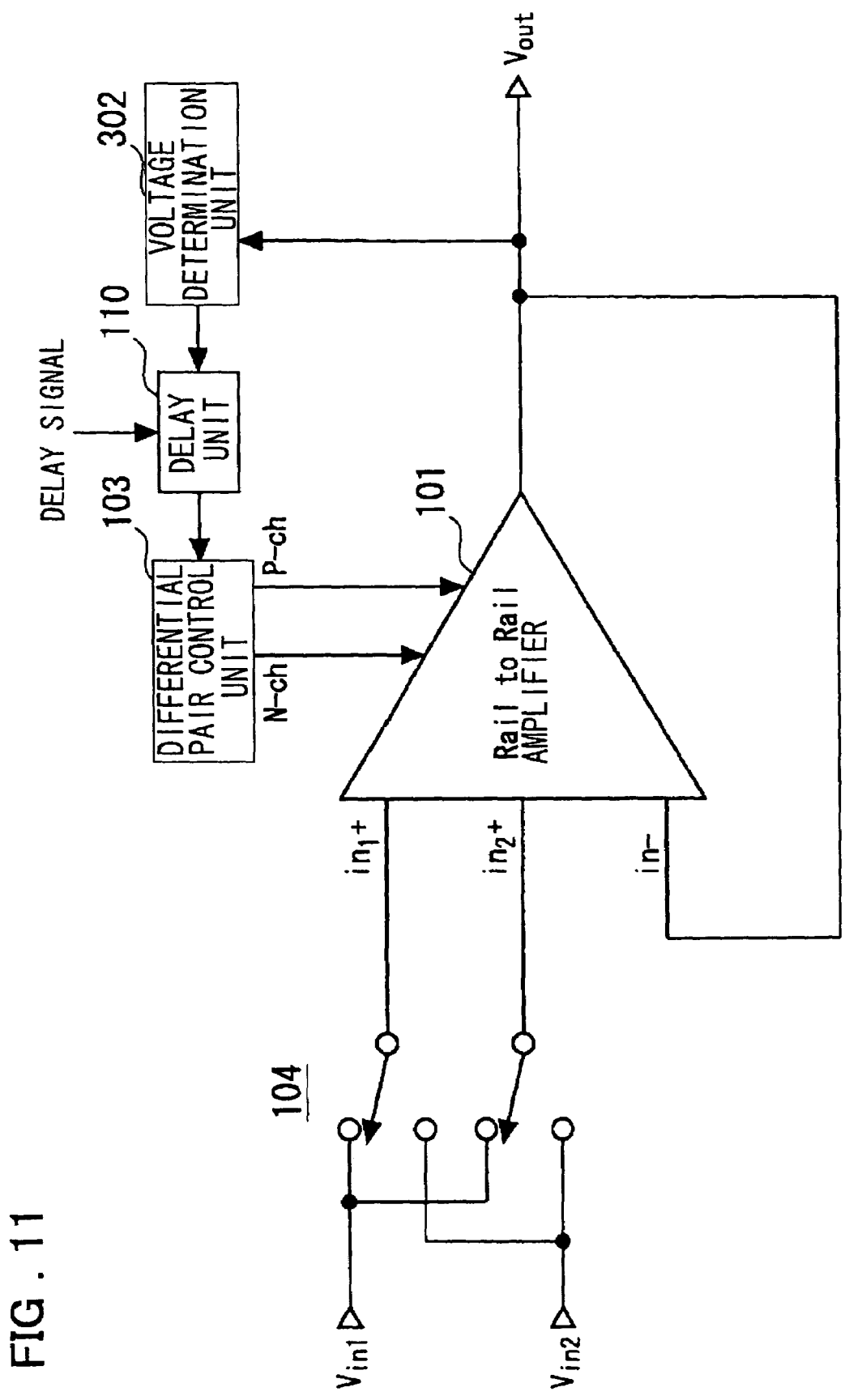
FIG. 11 is a diagram showing a configuration of a differential amplifier according to a fifth embodiment of the present invention.

Next, a fifth embodiment of the present invention will be described using FIG. 11. Referring to FIG. 11, the fifth embodiment of the present invention includes a delay unit 110 between the output of the voltage determination unit 302 and the differential pair control unit 103 in the configuration described in the second embodiment. The voltage determination unit 302 has the same configuration as that described in the second embodiment. As shown in FIG. 11, the reference voltage to be supplied to the voltage determination unit 302 does not need to be the output voltage itself, and may be arbitrary if the reference voltage is the voltage that changes according to the output voltage Vout.

The delay unit 110 inputs the output signal of the voltage determination unit 302 and a delay signal, and during one output period, the delay unit 110 has the following function of:

forcefully outputting a signal indicating that the differential pairs should not be stopped until a first time Ts of the one output period; and passing the result by the voltage determination unit 302 during the period after the Ts to the end of the one output period.

For this reason, even if the result of determination by the voltage determination unit 302 indicates that "the differential pairs should be stopped", the differential pairs are not stopped until the time Ts.

For this reason, driving using the differential pairs of both channels is performed until the time Ts during each of the rising and falling periods.

Figure 12:
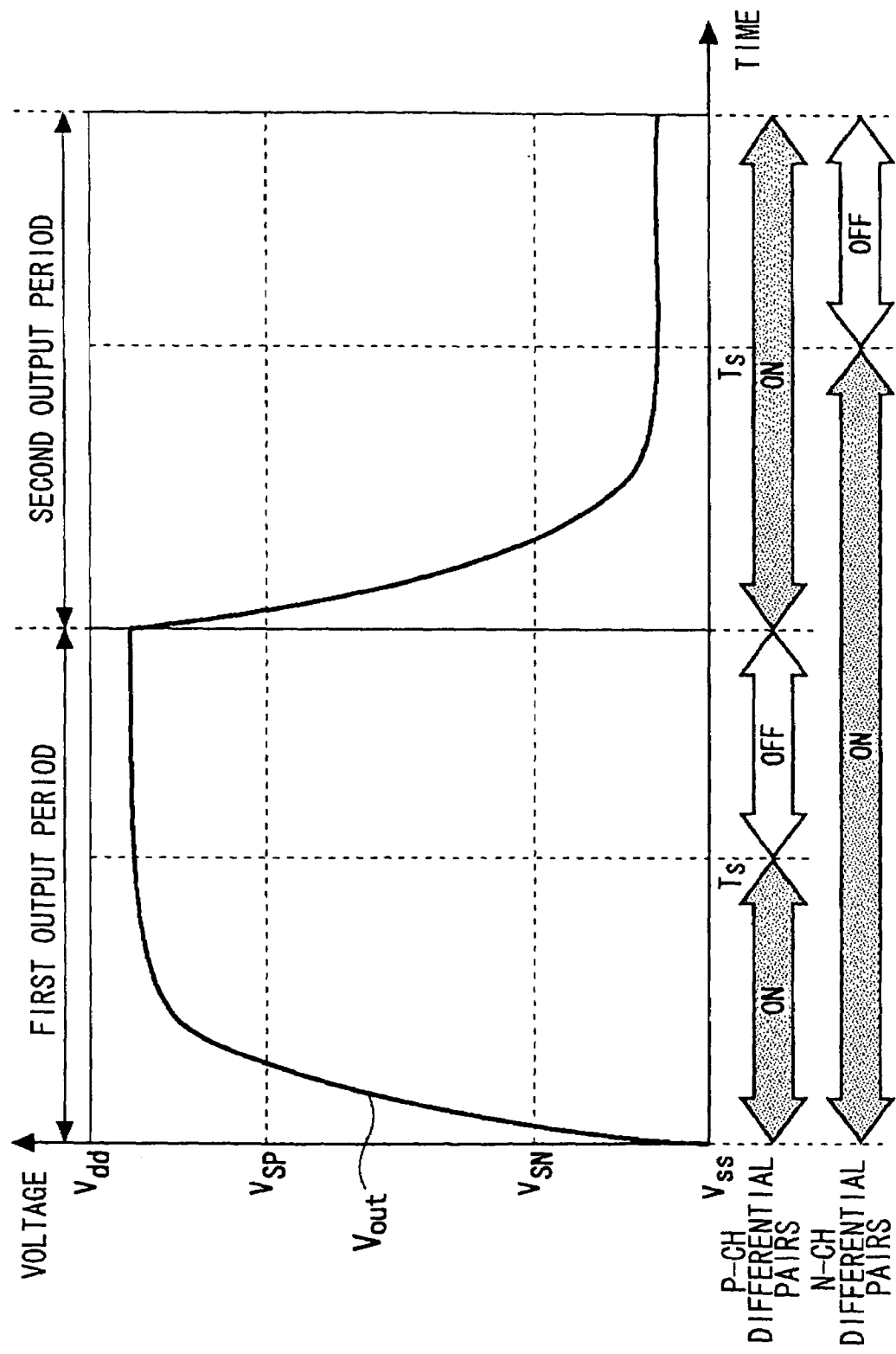
FIG. 12 is a graph showing ON/OFF timings of differential pairs in the fifth embodiment of the present invention.

The ON/OFF timings of the differential pairs when the output voltage Vout is changed from the error-producing voltage on the high-potential supply voltage side to the error-producing voltage on the low-potential supply voltage side become those as shown in FIG. 12.

According to the present embodiment, high-accuracy output over the full range of output voltages becomes possible. In addition, driving using the differential pairs of both of the channels can be performed until the output reaches around a target voltage. For this reason, the slew rate can be improved more than in the second through fourth embodiments.

Sixth Embodiment

Figure 13:
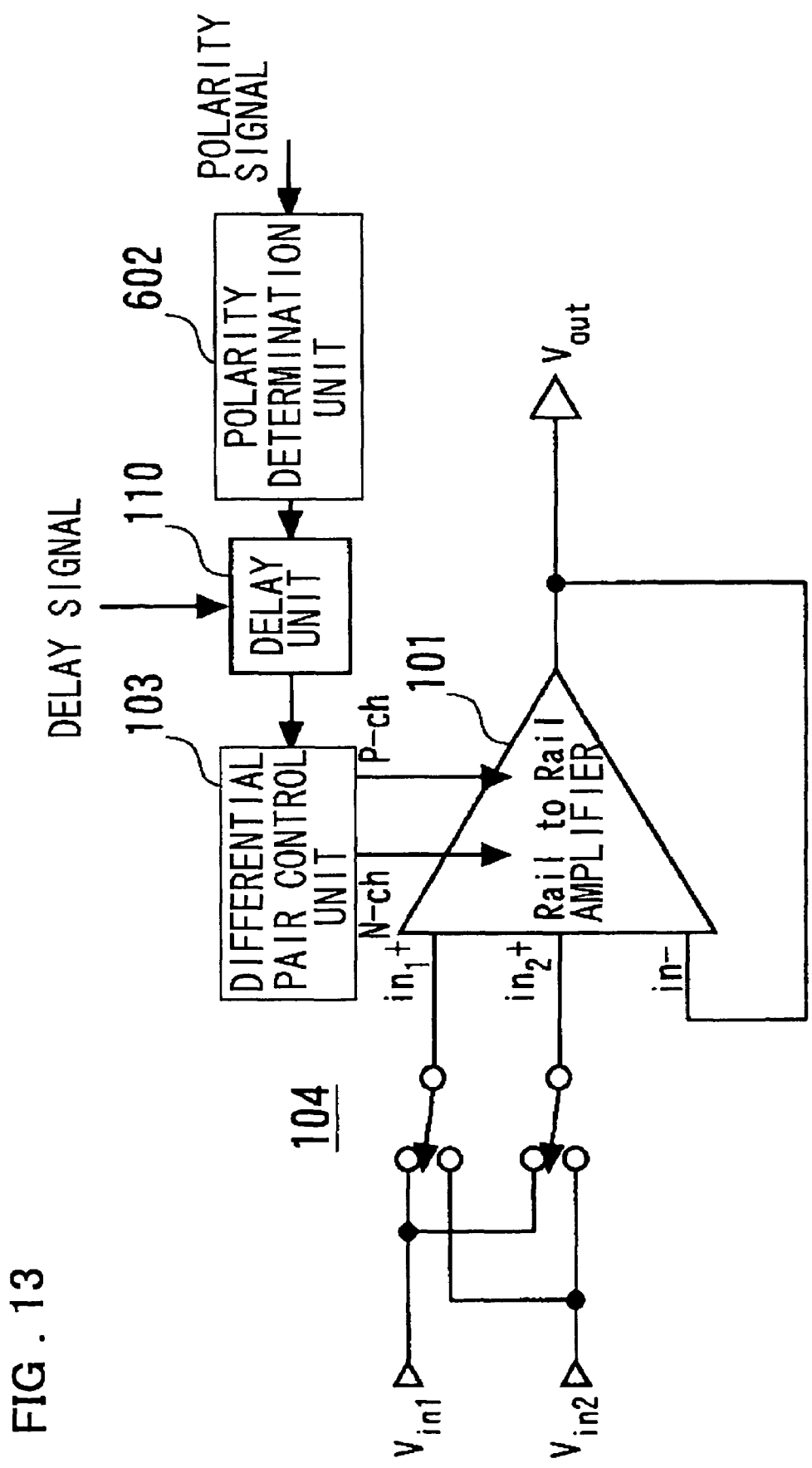
FIG. 13 is a diagram showing a configuration of a differential amplifier according to a sixth embodiment of the present invention.

Next, a sixth embodiment of the present invention will be described using FIG. 13. Referring to FIG. 13, the sixth embodiment of the present invention is configured by adding the delay unit 110 to a determination system using the polarity described in the third embodiment.

The polarity determination unit 602 has the same configuration as that described in the third embodiment. The delay unit 110 has the same configuration as that described in the fifth embodiment.

Even if the result of determination by the polarity determination unit 602 indicates that the "differential pairs should be stopped", the differential pairs are not stopped until the certain time Ts. With this arrangement, driving is performed using the differential pairs of both of the channels during the rising and falling periods.

Figure 14:
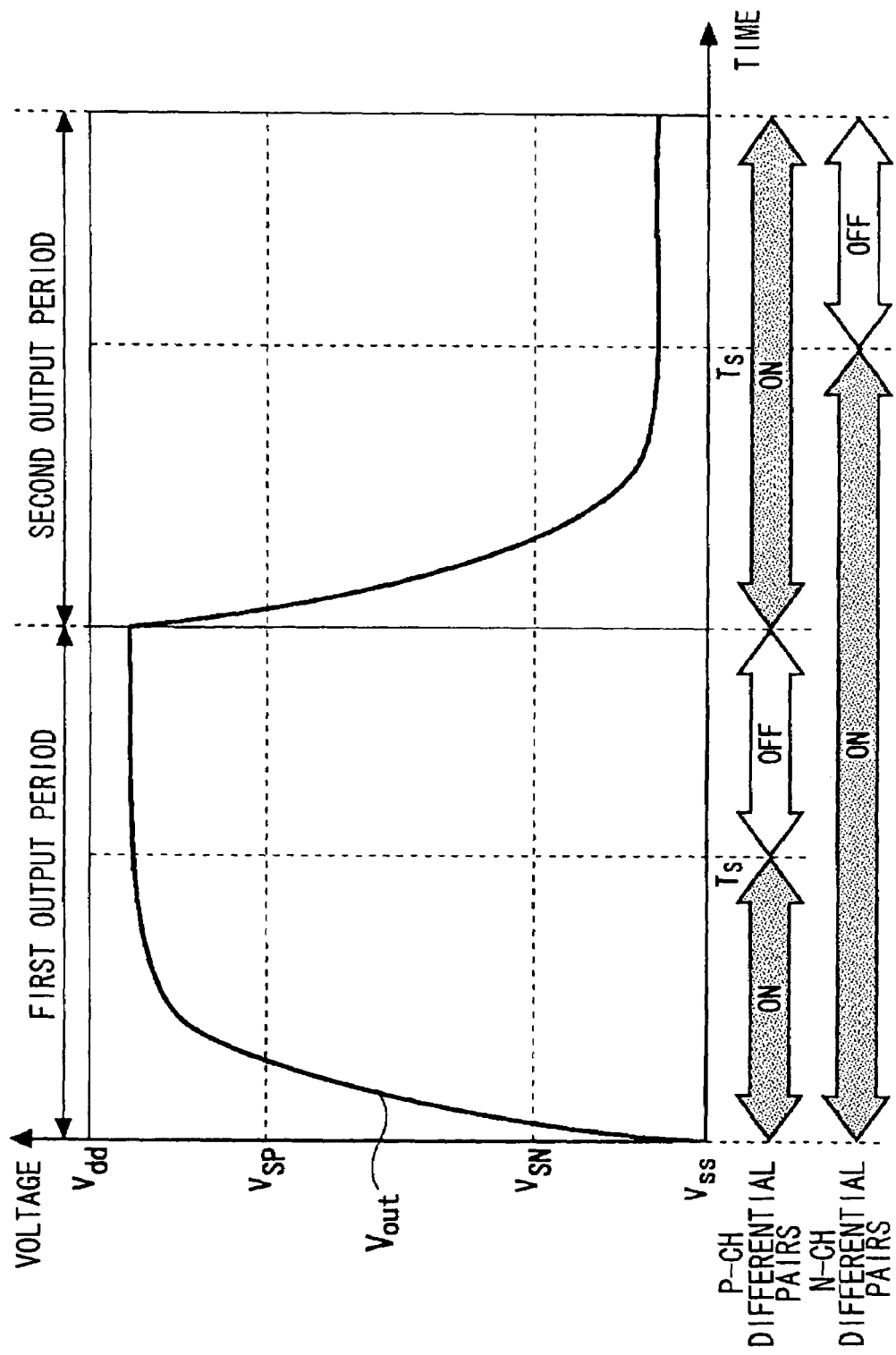
FIG. 14 is a graph showing ON/OFF timings of differential pairs in the sixth embodiment of the present invention.

The ON/OFF timings of the differential pairs when the output voltage Vout is changed from the error-producing voltage on the high-potential supply voltage side to the error-producing voltage on the low-potential supply voltage side in the present embodiment become those as shown in FIG. 14.

Driving with the differential pairs of both channels can be performed during the rising and falling periods. Thus, compared with the system described in the third embodiment, the slew rate can be more greatly improved.

According to the present embodiment, high-accuracy output over the full range output voltages. In addition, driving the differential pairs of both of the channels can be performed until the output reaches around a target voltage. For this reason, the slew rate can be improved more than in the second through fourth embodiments.

Seventh Embodiment

Next, a seventh embodiment of the present invention will be described. The differential amplifier described in the first through sixth embodiment can be employed for a buffer unit 988 of the data driver of a display device, as shown in FIG. 15.

According to the present invention, the buffer unit 988 can output three or more different voltages according to the selection condition of the input voltages Vin1 and Vin2. Thus, the number of input gray scales can be reduced more than the number of output gray scales. Accordingly, the number of output power supply lines of a gray scale voltage generation circuit 986 and the number of input power supply lines of decoders 987 can be reduced more than that of a gray scale generation circuit 983 and that of decoders 984 in a data driver shown in FIG. 21. For this reason, the chip area of the data driver can be reduced.

Figure 15:
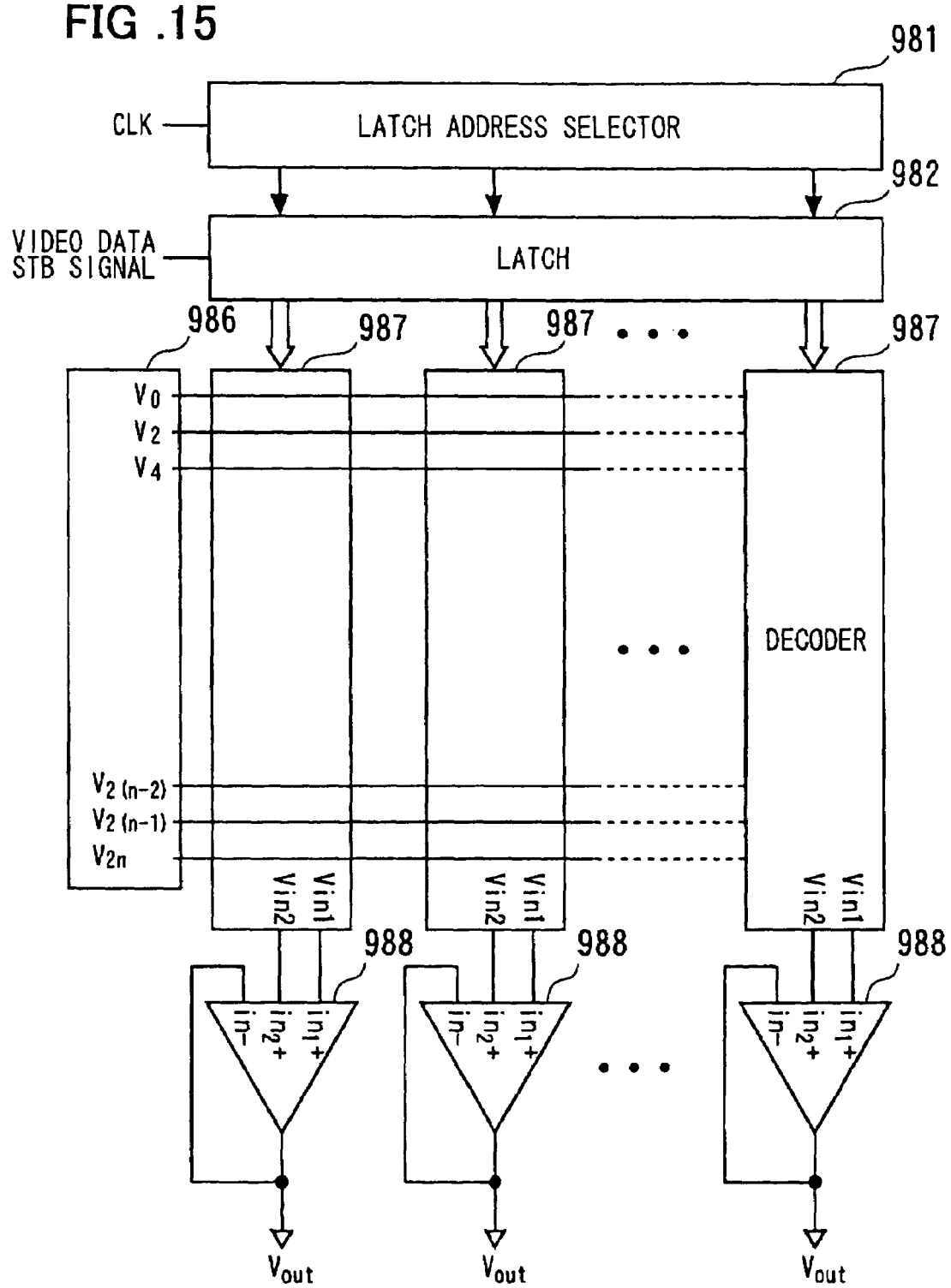
FIG. 15 is a diagram showing a configuration of a data driver in a seventh embodiment of the present invention.
Figure 21:
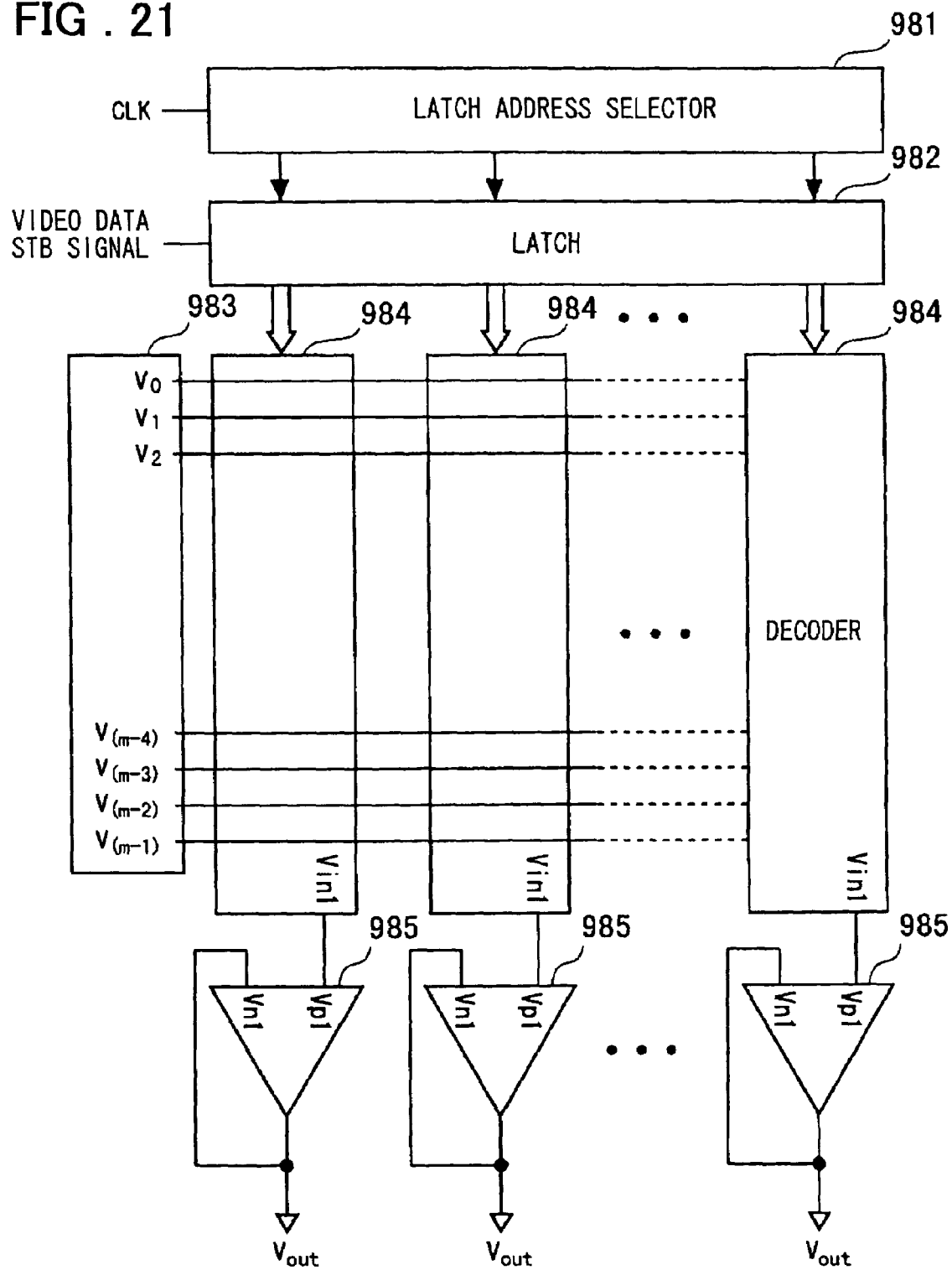
FIG. 21 is a diagram showing a configuration of a data driver in FIG. 20.

Gray scale voltages V0, V1, V2, ... and V(m−1) of the gray scale generation circuit 983 in FIG. 21, for example, can be set to V0, V2, V4, ... and V2$k$ (for two divided outputs, and in which k is a positive integer) as in the gray scale generation circuit 986 in FIG. 15, or V0, V4, V8, ... , and V4$l$ (for four divided outputs and in which l is a positive integer), or the like. The number of the input power supply lines can be reduced. In addition, high-accuracy output over the full range of provided supply voltages becomes possible. An embodiment will be described below.

Figure 16:
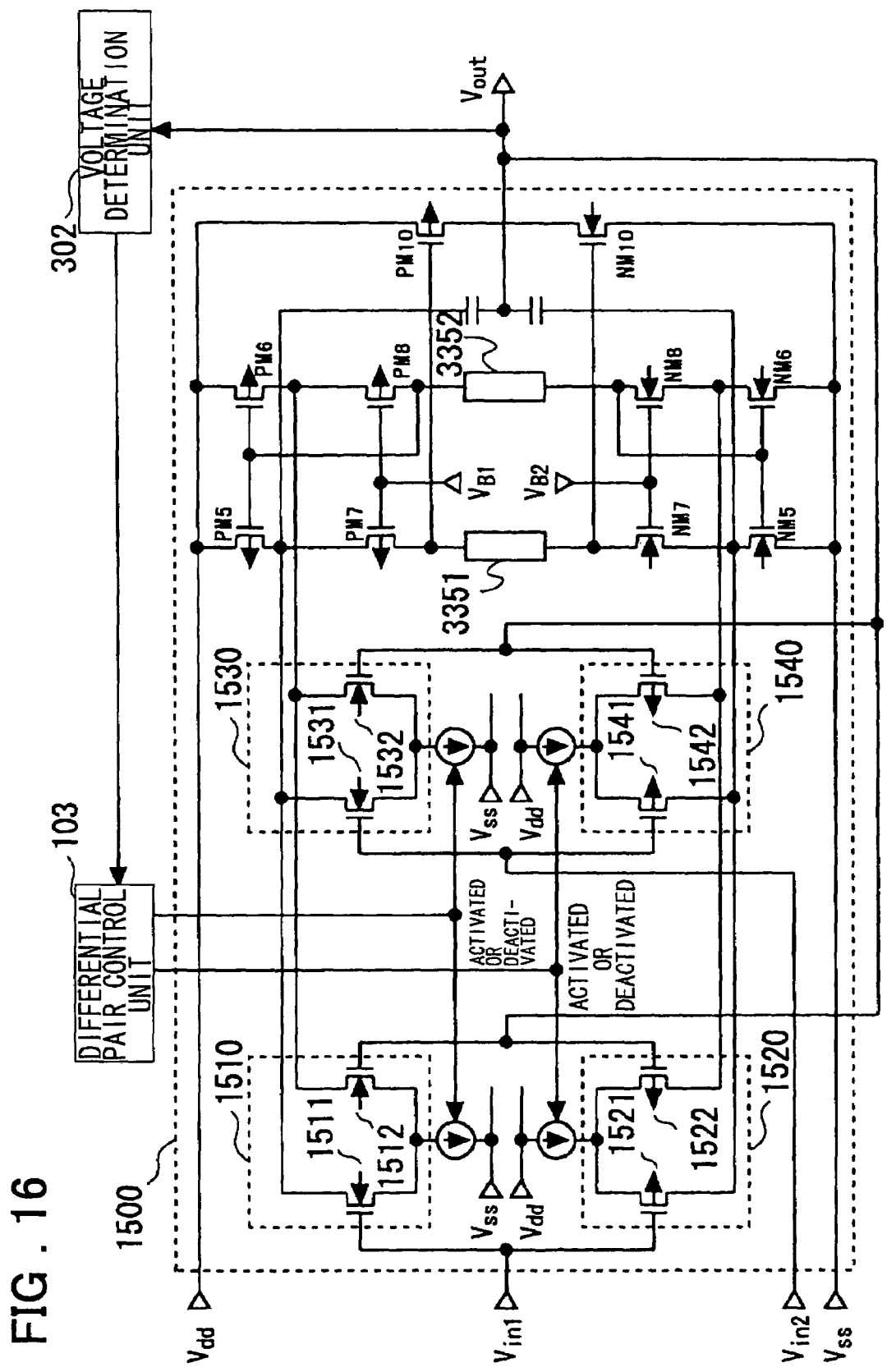
FIG. 16 is a diagram showing a configuration of an embodiment of the present invention.

An example of the present invention will be described using FIG. 16. Referring to FIG. 16, reference numeral 1500 denotes a Rail-to-Rail amplifier having two kinds of different pairs of the same polarity each constituted from two differential pairs. A Vin1 is connected to one non-inverting inputs 1511 and 1521 of an N-ch differential pair 1510 and a P-ch differential pair 1520, respectively. The Vout is feedback connected to inverting inputs 1512 and 1522 of the N-ch differential pair 1510 and the P-ch differential pair 1520, respectively. A Vin2 is connected to the other non-inverting inputs 1531 and 1541 of differential pairs 1530 and 1540, respectively, and the Vout is feedback connected to inverting inputs 1532 and 1542 of the differential pairs 1530 and 1540, respectively. Incidentally, referring to FIG. 16, configurations of load circuits and output amplification stages (PM10, NM10) for the N-ch differential pairs 1510 and 1530 and the P-ch differential pairs 1520 and 1540 are set to be the same as those shown in FIG. 24.

In this Rail-to-Rail amplifier, when the Vin1 is equal to the Vin2,

Vout=Vin1=Vin2 holds.

when Vin1 is not equal to the Vin2, an internally divided voltage Vout=(Vin1+Vin2)/2 can be output.

The output voltage Vout is supplied to the voltage determination unit 302 as the reference voltage.

Assume that this Rail-to-Rail amplifier alone has output accuracy shown in FIG. 25. Then, no error is considered to be produced over the full range of voltage when the following settings of the output voltage are performed:

When Vss≦Vout≦3.0[V], the N-ch differential pairs should be stopped;

When 12.0[V]≦Vout≦Vdd, the P-ch differential pairs should be stopped.

Since the relationship of Vref=Vout is established in the present embodiment, the voltage determination unit 302 should output the result of determination indicating as follows:

when Vss≦Vref≦3.0[V], the N-ch differential pairs should be stopped; or when 12.0[V]≦Vref≦Vdd, the P-ch differential pairs should be stopped.

The voltage determination unit 302 is configured by using the comparator as shown in FIGS. 5A and 5B.

When the format of the signal outputting the result of determination follows Table 1 described in the first embodiment, the relationships between the output voltage Vout and turning ON/OFF of the differential pairs becomes the ones as shown in FIG. 17.

Figure 18:
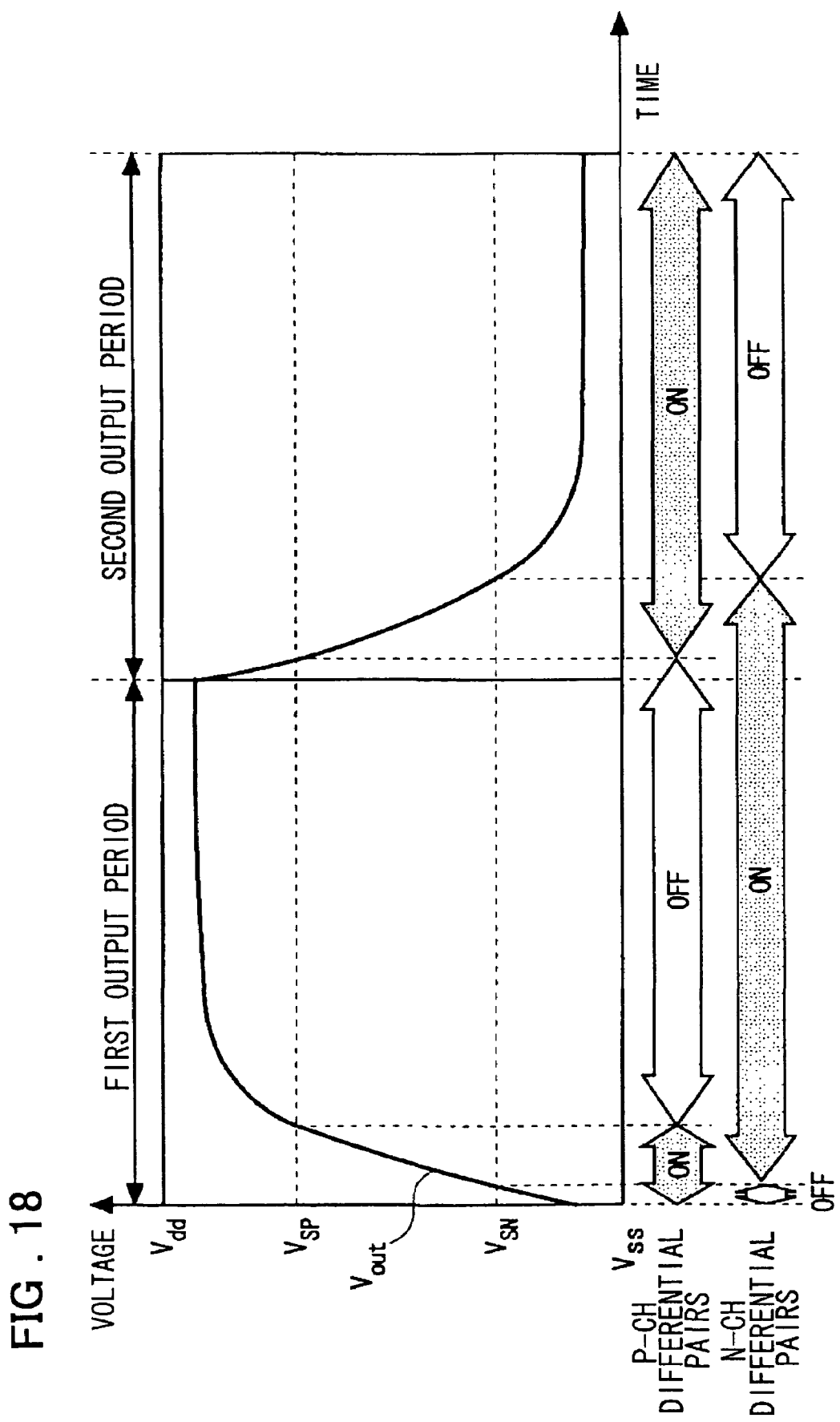
FIG. 18 is a graph showing ON/OFF timings of the differential pairs in the embodiment of the present invention.

The ON/OFF timings of the differential pairs when the output voltage Vout is changed from the error-producing voltage on the high-potential supply voltage side to the error-producing voltage on the low-potential supply voltage side become those as shown in FIG. 18.

Referring to FIG. 18, first, in the first output period (of positive polarity), the N-ch differential pairs are stopped until the output voltage Vout gets out of the range of the error-producing voltage on the low-potential supply voltage side.

Then, when the output voltage Vout reaches the range of the voltage (from the VSN to the VSP) in which no error is produced, the P-ch differential pairs and the N-ch differential pairs are operated.

When the output voltage Vout reaches the range of the error-producing voltage on the high-potential supply voltage side, the P-ch differential pairs are then stopped, and only the N-ch differential pairs are operated.

Next, in the second output period, until the output voltage Vout gets out of the range of the error-producing voltage on the high-potential supply voltage side, the P-ch differential pairs are stopped.

Then, when the output voltage Vout reaches the range of the voltage (from the VSN to the VSP) in which no error is produced, the P-ch differential pairs and the N-ch differential pairs are operated.

When the output voltage Vout reaches the range of the error-producing voltage on the low-potential supply voltage side, the N-ch differential pairs are then stopped, and only the P-ch differential pairs are operated.

Figure 19:
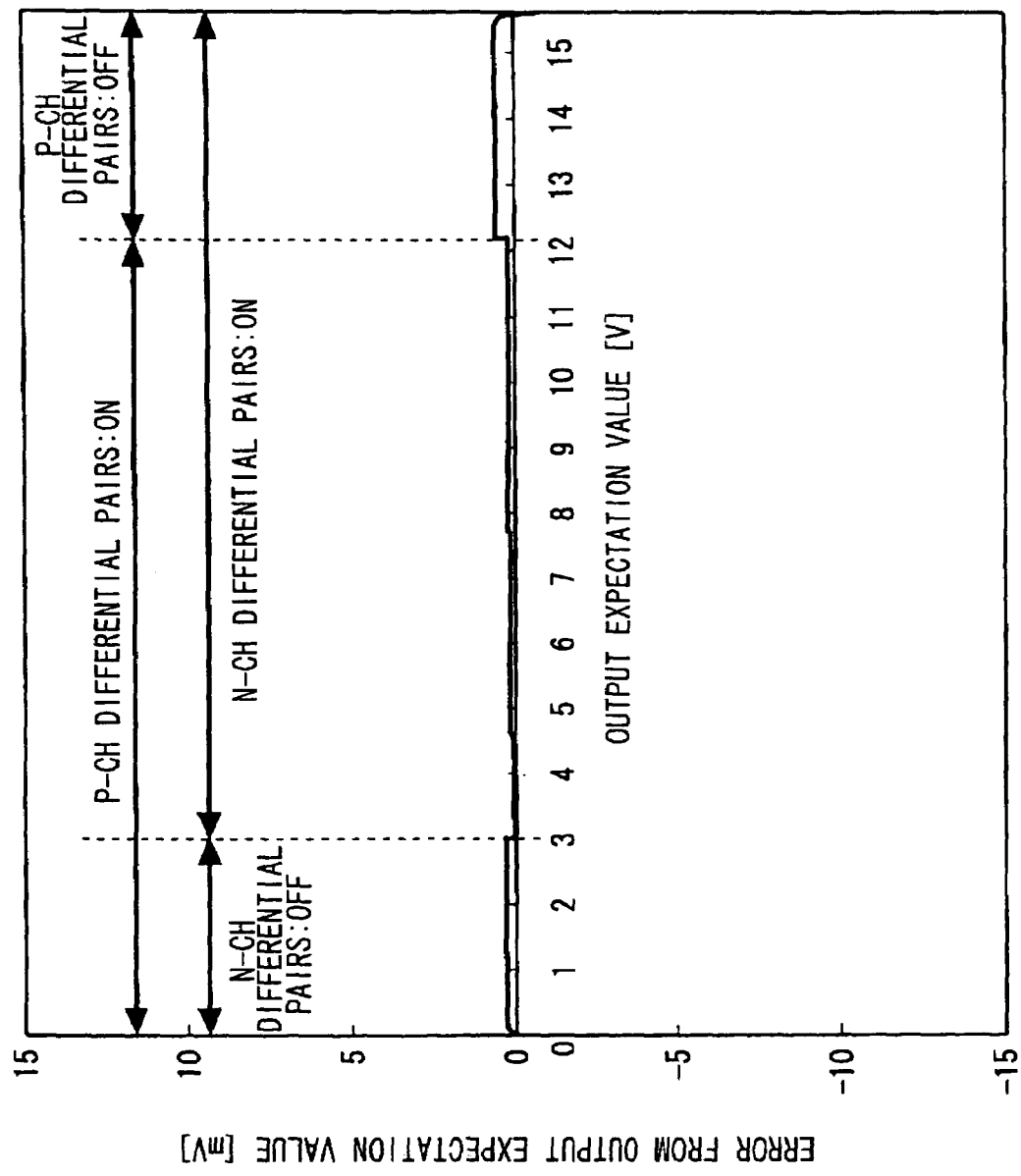
FIG. 19 is a graph showing output accuracy in the embodiment of the present invention.
Figure 20:
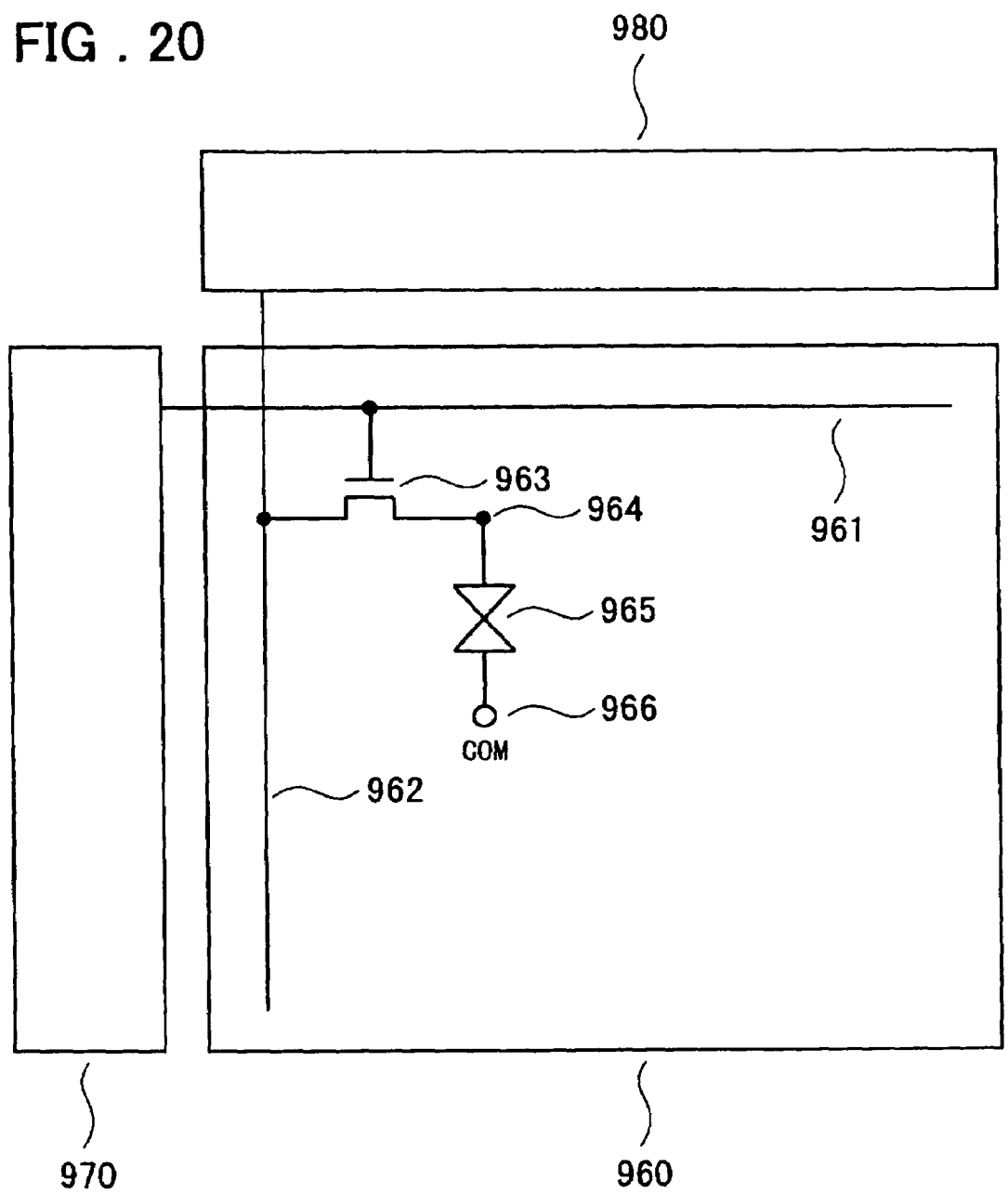
FIG. 20 is a diagram showing a configuration of an active matrix type liquid crystal display device.

When the output accuracy is checked over the full range of supplied voltages with a voltage difference between the two voltages Vin1 and Vin2 to be supplied to this amplifier maintained at 0.2V (in which Vin1>Vin2), the output accuracy becomes the one as shown in FIG. 19. It can be confirmed from this graph that high-accuracy output over the full range of the supplied voltages becomes possible.

Foregoing detailed descriptions were directed to various embodiments of the present invention. The Rail-to-rail amplifier shown in the description of the present invention is not limited to this configuration. Two differential pairs 3310 and 3320 in FIG. 24, for example, may be configured to be driven by a common current source, and connecting relationships among inverting and non-inverting inputs in other mode may be used. In other words, the present invention can be applied to an arbitrary amplifier if it is the Rail-to-Rail amplifier having two kinds of different pairs of the same polarity each constituted from two differential pairs. The present invention of course includes various variations and modifications that could be made by those skilled in the art within the scope of the present invention.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A differential amplifier comprising:

a plurality of differential pairs of a first conductivity type and a plurality of differential pairs of a second conductivity type, each of said differential pairs of the first and second conductivity type having one of an input pair thereof constituting an input terminal, said differential amplifier being capable of performing output from an output terminal thereof over a full range between first and second power supply voltages supplied to said differential amplifier;

a determination unit receiving at least one signal for determination and determining whether to stop operation of said differential pairs of said first conductivity type or operation of said differential pairs of said second conductivity type based at least upon a voltage characteristic of the at least one signal; and a differential pair control unit receiving a result of determination by said determination unit and switching between a first state and a second state according to the result of the determination, said first state making said differential pairs of said first conductivity type active, while making said differential pairs of said second conductivity type inactive, said second state making said differential pairs of said first conductivity type inactive, while making said differential pairs of said second conductivity type active, wherein the first state, said output terminal is driven only by said differential pairs of the first conductivity type and in the second state said output terminal is driven only by said differential pairs of the second conductivity type.

2. The differential amplifier according to claim 1, wherein said determination unit includes a comparator circuit for determining whether a level of the signal for determination is higher or lower than a predetermined value, and determines whether to stop the operation of said differential pairs of said first conductivity type or the operations of said differential pairs of said second conductivity type.

3. The differential amplifier according to claim 1, wherein said determination unit receives an output signal of said differential amplifier as the signal for determination; and said determination unit includes a comparator circuit for determining whether a voltage of the output signal of said differential amplifier is higher or lower than a predetermined voltage and determines whether to stop the operations of said differential pairs of said first conductivity type or the operations of said differential pairs of said second conductivity type.

4. The differential amplifier according to claim 1, wherein output pairs of said differential pairs of said first conductivity type are connected to a high-potential power supply through a first load circuit;
    output pairs of said differential pairs of said second conductivity type are connected to a low-potential power supply through a second load circuit;
    said determination unit receives an output signal of said differential amplifier as the signal for determination;
    when a voltage of the output signal of said differential amplifier is in a range from the low-potential supply voltage to a predetermined first voltage higher than the low-potential supply voltage, said determination unit outputs a result of determination indicating that the operation of said differential pairs of said first conductivity type should be stopped;
    when the voltage of the output signal of said differential amplifier is in a range from the high-potential supply voltage to a predetermined second voltage lower than the high-potential supply voltage and higher than the first voltage, said determination unit outputs a result of determination indicating that the operation of said differential pairs of said second conductivity type should be stopped; and
    when the voltage of the output signal of said differential amplifier is in a range between the first voltage and the second voltage, said determination unit outputs a result of determination indicating that both of said differential pairs of said first conductivity type and said differential pairs of said second conductivity type should be operated.

5. The differential amplifier according to claim 1, wherein output pairs of said differential pairs of said first conductivity type are connected to a high-potential power supply through a first load circuit;
    output pairs of said differential pairs of said second conductivity type are connected to a low-potential power supply though a second load circuit;
    said determination unit outputs a result of determination indicating that the operation of said differential pairs of said first conductivity type should be stopped when a voltage of an output signal of said differential amplifier or a reference voltage generated based on the voltage of the output signal is in a range from a predetermined first voltage to a predetermined second voltage higher than the first voltage;
    said determination unit outputs a result of determination indicating that the operation of said differential pairs of said second conductivity type should be stopped when the reference voltage is in a range from a predetermined third voltage to a predetermined fourth voltage, the predetermined third voltage being higher than the second voltage and the predetermined fourth voltage being higher than the third voltage; and
    said determination unit outputs a result of determination indicating that said differential pairs of the first conductivity type and said differential pairs of the second conductivity type should be both operated when the voltage of the output signal of said differential amplifier is in a range between the second voltage and the third voltage.

6. The differential amplifier according to claim 1, wherein said determination unit receives a polarity signal indicating a polarity of an output signal as the signal for determination; and
    when the polarity signal indicates a positive polarity, the operations of one of said differential pairs of said first conductivity type and said differential pairs of said second conductivity type are stopped, and when the polarity signal indicates a negative polarity, the operations of the other of said differential pairs of said first conductivity type and said differential pairs of said second conductivity type are stopped.

7. The differential amplifier according to claim 1, wherein said determination unit receives first and second signals for determination;
    the second signal for determination comprises a polarity signal indicating a polarity of an output signal;
    said determination unit comprises:
    a first determination unit for determining whether a level of the input first signal for determination is higher or lower than a predetermined value; and
    a second determination unit for stopping the operation of said differential pairs of said second conductivity when the second signal for determination indicates a positive polarity and stopping the operation of said differential pairs of said first conductivity when the second signal for determination indicates a negative polarity; and
    a result of determination to said differential pair control unit is output, based on the result of determination by said first determination unit and the result of determination by said second determination unit.

8. The differential amplifier according to claim 1, further comprising:
    a delay unit for performing control so that the result of determination by the determination unit is supplied to said differential pair control unit with a delay of a predetermined time period.

9. The differential amplifier according to claim 8, wherein said delay unit performs control so that the result of determination from said determination unit about the operations is delayed, for supply to said differential pair control unit, when the result of determination from said determination unit indicates that the operation of said differential pairs of said first conductivity type or the operation of said differential pairs of said second conductivity type should be stopped.

10. The differential amplifier according to claim 1, wherein control is performed so that at least in a voltage segment in the vicinity of a high-potential power supply voltage, in which an error may be produced in the output from said output terminal, said differential pairs of said first conductivity type responsible for the error are deactivated and in a voltage segment in the vicinity of a low-potential power supply voltage, in which an error may be produced in said output from said output terminal, said differential pairs of said second conductivity type responsible for the error are deactivated.

11. The differential amplifier according to claim 1, further comprising:
    a switching circuit for selectably supplying first and second input signal voltages to non-inverting input terminals of said differential pairs of said first conductivity type and said differential pairs of said second conductivity type, respectively;
    said output terminal being feedback connected to inverting-input terminals of said differential pairs of said first type and said differential pairs of said second type.

12. The differential amplifier according to claim 1, wherein a current source for driving each of said differential pairs of said first conductivity type or said differential pairs of second conductivity type controlled to be deactivated is deactivated.

13. The differential amplifier according to claim 1, wherein in said differential pairs of said first conductivity type or said differential pairs of said second conductivity type controlled to be deactivated, propagation of an output of said differential pairs to said output terminal of said differential amplifier is inhibited.

14. The differential amplifier according to claim 4, wherein said first and second load circuits comprise first and second current mirror circuits, respectively; and said differential amplifier further comprises:

a first output transistor for charging said output terminal and a second output transistor for discharging said output terminal, control terminals of said first and second output transistors being connected to a connection node between an output terminal of said first current mirror circuit and outputs of said differential pairs of said first conductivity type and a connection node between an output terminal of said second current mirror circuit and outputs of said differential pair of said second conductivity type, respectively.

15. The differential amplifier according to claim 4, wherein current mirror circuits, composing said first and second load circuits comprise first and second folded current mirror circuits, respectively, said first and second folded current mirror circuits each having a plurality of cascaded transistor pairs; and said differential amplifier further comprises:

a first output transistor for charging said output terminal and a second output transistor for discharging said output terminal, control terminals of said first and second output transistors being connected to a connection node between an output terminal of said first folded current mirror circuit and an output of said differential pair of said first conductivity type and a connection node between an output terminal of said second folded current mirror circuit and an output of said differential amplifiers of said second conductivity type, respectively.

16. The differential amplifier according to claim 1, wherein said differential pairs of the first conductivity type comprises at least two differential pairs receiving differential input voltages, different each other, respectively and said differential pairs of the second conductivity type comprises at least two differential pairs receiving differential input voltages, different each other, respectively.

17. A data driver for a display device comprising:

a gray scale voltage generation circuit for generating a plurality of voltage levels;

decoders including a plurality of output terminals, for outputting from said plurality of output terminals a plurality of voltages selected from among the plurality of voltage levels based on input data; and buffer circuits with input terminals thereof connected to said plurality of output terminals of said decoders, respectively, for outputting the voltages associated with the input data from output terminals thereof;

wherein each of said buffer circuits comprises the differential amplifier according to claim 1.

18. A display device comprising:

a plurality of data lines extended in parallel with one another in one direction;

a plurality of scan lines extended in parallel with one another in a direction orthogonal to the one direction;

a plurality of pixel electrodes arranged at intersections between said plurality of data lines and said plurality of scan lines in a matrix form;

a plurality of transistors each with one of a drain and a source thereof connected to a corresponding one of said pixel electrodes, the other of the drain and the source thereof connected to a corresponding one of said plurality of data lines, and a gate thereof connected to a corresponding one of said scan lines;

a gate driver for supplying a scan signal to each of said plurality of scan lines; and the data driver for supplying a gray scale signal associated with the input data to each of said plurality of data lines; wherein said data driver is the data driver for a display device according to claim 17.

19. A differential amplifier comprising:

a differential pair of a first conductivity type and a differential pair of a second conductivity type, each having one of an input pair thereof constituting an input terminal, said differential amplifier being capable of performing output from an output terminal thereof over a full range between first and second power supply voltages supplied to said differential amplifier;

a determination unit receiving at least one signal for determination and determining whether to stop operation of said differential pair of said first conductivity type or operation of said differential pair of said second conductivity type based at least upon a voltage characteristic of the at least one signal; and a differential pair control unit receiving a result of determination by said determination unit and switching between a first state and a second state according to the results of the determination, said first state making said differential pair of said first conductivity type active, while making said differential pair of said second conductivity type inactive, said second state making said differential pair of said first conductivity type inactive, while making said differential pair of said second conductivity type active, wherein in the first state, said output terminal is driven only by said differential pair of the first conductivity type and in the second state, said output terminal is drive only by said differential pair of the second conductivity type.

20. A differential amplifier including a plurality of differential pairs of a first conductivity type and a plurality of differential pairs of a second conductivity type, each of said differential pairs of the first and second conductivity type having one of an input pair thereof constituting an input terminal, said differential amplifier being capable of performing output from an output terminal thereof over a full range between first and second power supply voltages supplied to said differential amplifier, said differential amplifier comprising:

a determination unit receiving at least one signal for determination and determining whether to stop operation of said differential pairs of said first conductivity type or operation of said differential pairs of said second conductivity type; and a differential pair control unit receiving a result of determination by said determination unit and controlling activation and deactivation of said differential pairs of said first conductivity type and said differential pairs of said second conductivity type according to said result of determination, wherein said determination unit receives a polarity signal indicating a polarity of an output signal as the signal for determination, and when the polarity signal indicates a positive polarity, the operations of one of said differential pairs of said first conductivity type and said differential pairs of said second conductivity type are stopped, and when the polarity signal indicates a negative polarity, the operations of the other of said differential pairs of said first conductivity type and said differential pairs of said second conductivity type are stopped.

* * * * *